US008487258B2

(12) United States Patent
Sono et al.

(10) Patent No.: US 8,487,258 B2
(45) Date of Patent: Jul. 16, 2013

(54) PYROELECTRIC INFRARED DETECTION ELEMENT AND INFRARED SENSOR USING THE SAME

(75) Inventors: Takahiro Sono, Shiga (JP); Teruki Hatatani, Osaka (JP); Suguru Fukui, Osaka (JP); Takayuki Nishikawa, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/580,463

(22) PCT Filed: Jun. 23, 2011

(86) PCT No.: PCT/JP2011/064348
§ 371 (c)(1), (2), (4) Date: Sep. 4, 2012

(87) PCT Pub. No.: WO2011/162319
PCT Pub. Date: Dec. 29, 2011

(65) Prior Publication Data

US 2012/0318980 A1 Dec. 20, 2012

(30) Foreign Application Priority Data

Jun. 25, 2010 (JP) ................................ 2010-145393

(51) Int. Cl.
*G01J 5/00* (2006.01)

(52) U.S. Cl.
USPC ...................................................... 250/338.3

(58) Field of Classification Search
USPC ...................................................... 250/338.3
See application file for complete search history.

(56) References Cited

U.S. PATENT DOCUMENTS 5,193,911 A 3/1993 Nix et al.
6,121,614 A 9/2000 Taniguchi et al.
2001/0020681 A1* 9/2001 Yagyu et al. .............. 250/338.3

FOREIGN PATENT DOCUMENTS

JP 05-005652 1/1993
JP 05-050329 U 7/1993
JP 10-002793 1/1998
JP 10-300570 A 11/1998
JP 11-006763 A 1/1999

(Continued)

OTHER PUBLICATIONS

International Search Report for corresponding International Application No. PCT/JP2011/064348 mailed Oct. 4, 2011.
Form PCT/ISA/237 for corresponding International Application No. PCT/JP2011/064348 dated Oct. 4, 2011.

*Primary Examiner* — David P. Porta
*Assistant Examiner* — Kenneth J Malkowski
(74) *Attorney, Agent, or Firm* — Renner, Otto, Boisselle & Sklar, LLP

(57) ABSTRACT

The pyroelectric infrared detection element has a pyroelectric element including opposite first and second electrodes and an infrared absorption part. The first and second electrodes are formed on first and second thickness-direction surfaces of a pyroelectric substrate respectively. The detection element includes an output terminal unit including first and second output terminals on the substrate, and first and second wiring parts connecting the first and second output terminals to the first and second electrodes respectively. The first wiring part includes a connecting line being a conductive layer on the first surface to connect the first output terminal to the first electrode, and a canceling line for canceling charges generated at the connecting line in response to a change in temperature of the substrate. The canceling line is a conductive layer on the second surface to be insulated from the second electrode and to be connected to the connecting line.

11 Claims, 20 Drawing Sheets

FOREIGN PATENT DOCUMENTS

| | | | |
|---|---|---|---|
| JP | 11-014452 | A | 1/1999 |
| JP | 3773623 | B | 2/2006 |
| WO | 2006/112122 | A1 | 10/2006 |
| WO | 2006/120863 | A1 | 11/2006 |

* cited by examiner 51 (51A)
512 (512A)
511 (511A)
101
51 (51B)
512 (512B)
511 (511B)
10
411
421
20 (20A)
31 (31A)
11 (11A)
20 (20B)
32 (32B)
11 (11B)
C
C
+
+
—
—
521 (521A)
522 (522A)
52 (52A)
521 (521B)
522 (522B)
52 (52B)
410 (400)
420 (400)
40

101
10
512 (512A)
511 (511B)
412
422
32 (32A)
31 (31B)
410
420
521 (521A)
522 (522B)

PYROELECTRIC INFRARED DETECTION ELEMENT AND INFRARED SENSOR USING THE SAME

TECHNICAL FIELD

The present invention relates to a pyroelectric infrared detection element for detecting infrared and an infrared sensor using the same.

BACKGROUND ART

The pyroelectric infrared detection element (a pyroelectric element) detects infrared by use of the pyroelectric effect. Such a pyroelectric infrared detection element has been frequently used for an infrared sensor such as a human body detection sensor for detecting a movement of a human body.

The pyroelectric effect is a phenomenon that electric charges are generated on a surface in response to a change in a temperature. When infrared strikes the pyroelectric infrared detection element in an equilibrium state in which electric charges resulting from spontaneous polarization are neutralized by ions from an external air, the infrared heats a pyroelectric substrate, and a temperature change of the pyroelectric substrate occurs. Such a temperature change may break the equilibrium state of electric charges, and then electric charges are generated on the surface of the pyroelectric substrate.

As an infrared sensor using a pyroelectric infrared detection element, an infrared sensor that a pyroelectric infrared detection element and a current voltage conversion circuit are housed in a single package has been well known. The current voltage conversion circuit is configured to convert a current caused by a movement of electric charges generated at the pyroelectric infrared detection element into a voltage signal and then outputs the resultant voltage signal. In such an infrared sensor, the pyroelectric infrared detection element has impedance of about 100 GΩ, and a current (output current) outputted from the pyroelectric infrared detection element is very weak. In view of the above, a current voltage conversion circuit employing an electric field effect transistor (FET) and a resistor has been well used. In such a current voltage conversion circuit, the electric field effect transistor is used for impedance conversion and has its gate connected to the pyroelectric infrared detection element, and the resistor is used for determining a gate voltage of the electric field effect transistor.

As the above pyroelectric infrared detection element, a dual element (a dual-type pyroelectric infrared detection element) and a quad element (a quad-type pyroelectric infrared detection element) have been put to practical use. The dual element is defined as an element in which two light receiving parts (infrared receiving parts) are provided to a single pyroelectric substrate. The quad element is defined as an element in which four light receiving parts are provided to a single pyroelectric substrate. Besides, as the above pyroelectric infrared detection element, a single element (a single-type pyroelectric infrared detection element) also has been put to practical use. The single element is defined as an element in which a single light receiving part is provided to a single pyroelectric substrate.

In the above pyroelectric infrared detection element, the pyroelectric substrate is made of pyroelectric material, such as, ceramic material (e.g., $PbTiO_3$, PZT, PZT-PMN (: Pb(Zr, $Ti)O_3$—$Pb(Mn,Nb)O_3$), single-crystal material (e.g., $LiTaO_3$), and high-polymer material (e.g., $PVF_2$). In addition, the light receiving part is constituted by paired two electrodes formed on opposite surfaces of the pyroelectric substrate in a thickness direction so as to be opposite to each other and a part of the pyroelectric substrate interposed between the paired two electrodes. Besides, each electrode may be made of electrically conductive infrared absorption material (e.g., NiCr).

Further, as the above pyroelectric infrared detection element, an pyroelectric infrared detection element in which a plurality of the light receiving parts is formed at a center of the pyroelectric substrate and output terminal units are formed at respective opposite ends of the pyroelectric substrate and wiring parts are formed to connect the electrodes of each light receiving part to the output terminal units respectively has been well known (c.f., document 1: JP 3773623 B2). In the pyroelectric infrared detection element disclosed in document 1, the electrodes of the light receiving part, the output terminal units, and the wiring parts are made of NiCr.

With regard to the infrared sensor using the pyroelectric infrared detection element, even when the light receiving part of the pyroelectric infrared detection element receives no infrared from a detection object (e.g., a human body), a false operation is likely to occur due to a temperature change of surrounding environment (usage environment). In view of the above, in such an infrared sensor, a dual-type pyroelectric infrared detection element which is configured such that external noise occurring simultaneously in the respective two light receiving parts cancels each other out is used (e.g., document 2: WO 2006/120863 A1, and document 3: WO 2006/112122 A1).

Document 3 discloses an infrared sensor that a pyroelectric infrared detection element is accommodated in a package. The package is constituted by a package body and an optical filter. The package is shaped into a box having an opened surface. The optical filter is configured to transmit infrared and is placed so as to cover the opened surface of the package body. In addition, document 3 discloses that the package body made of electrical insulation ceramic can be used as an alternative of the package body made of metal.

Further, in the past, there has been proposed a pyroelectric infrared detection element capable of suppressing popcorn noise occurring in an unexpected fashion due to a temperature change of surrounding environment (c.f., document 4: JP 10-300570 A). In the pyroelectric infrared detection element disclosed in document 4, a single-crystal $LiTaO_3$ substrate has a first part interposed between paired two electrodes and a second part other than the first part. The first part is designed to have a single domain structure with a defined spontaneous polarization direction. The second part is designed to have a multi-domain structure with a randomly oriented spontaneous polarization direction.

In the past infrared sensor, for example, it is considered that a path in which heat resulting from a temperature change in the surrounding environment is transferred to the pyroelectric infrared detection element may include a path in which the resultant heat is transferred from the package to the pyroelectric infrared detection element via gas inside the package, a path in which the resultant heat is transferred from the package to the pyroelectric infrared detection element via object supporting the pyroelectric infrared detection element inside the package, and a path in which the resultant heat is transferred from the package to the pyroelectric infrared detection element via heat emission.

Consequently, with regard to the prior infrared sensors, it is considered that influences given to the light receiving part by the temperature change in the surrounding environment may be different depending on a shape or material of the package, a distance between the package and the pyroelectric infrared detection element, and position relations among circuit components constituting the current voltage conversion circuit and the pyroelectric infrared detection element.

Hence, merely using a dual-type or quad-type pyroelectric infrared detection element as the pyroelectric infrared detection unit is not enough to cancel influences caused by temperature changes other than temperature changes simultaneously occurring in the respective light receiving parts with regard to external noise. In brief, the prior infrared sensor can cancel influences caused by a temperature change in a specified direction of the pyroelectric infrared detection element, but is likely to be affected by influences caused by a temperature change in a direction other than the specified direction.

With regard to the pyroelectric infrared detection element, when the temperature of the pyroelectric substrate is changed, electric charges are generated at entire opposite surfaces of the pyroelectric substrate in the thickness direction. Hence, in the prior pyroelectric infrared detection element, electric charges generated at a site other than the light receiving parts in addition to electric charges generated at the light receiving parts are outputted via the output terminal unit to the current voltage conversion circuit provided as an external circuit. Thus, the S/N ratio is likely to be decreased due to a change in the temperature of the surrounding environment.

Further, document 4 discloses a process of fabricating the pyroelectric infrared detection element. In this process, first, electrodes are formed on opposite surfaces in a thickness direction of a single-crystal $LiTaO_3$ substrate. Thereafter, the $LiTaO_3$ substrate is heated up to the Curie temperature so as not to show pyroelectric properties. Subsequently, the $LiTaO_3$ substrate is cooled down to a room temperature while a high electric field is applied between the opposite electrodes. Consequently, adopting the process disclosed in document 4 increases the number of steps of the process for fabricating the pyroelectric infrared detection element, and therefore the production cost thereof may be increased.

DISCLOSURE OF INVENTION

In view of the above insufficiency, the present invention has been aimed to propose a pyroelectric infrared detection element and an infrared sensor using the same which are capable of suppressing outputting electric charges caused by a temperature variation of a surrounding environment via an output terminal unit, without deteriorating pyroelectric performance of a pyroelectric substrate.

The first aspect of the pyroelectric infrared detection element in accordance with the present invention includes a pyroelectric element, an output terminal unit, a first wiring part, and a second wiring part. The pyroelectric element includes a first electrode, a second electrode opposite to the first electrode, and an infrared absorption part having pyroelectric properties and interposed between the first electrode and the second electrode. The output terminal unit includes a first output terminal and a second output terminal used for extracting a current generated by the pyroelectric element in response to a change in a temperature. The first wiring part is designed to connect the first output terminal to the first electrode. The second wiring part is designed to connect the second output terminal to the second electrode. The first electrode is formed on a first surface of a pyroelectric substrate made of pyroelectric material in a thickness direction. The second electrode is formed on a second surface of the pyroelectric substrate in the thickness direction. The infrared absorption part is defined as a part of the pyroelectric substrate interposed between the first electrode and the second electrode. The first output terminal and the second output terminal are formed on the pyroelectric substrate. The first wiring part includes a connecting line and a canceling line. The connecting line is constituted by an electrically conductive layer formed on the first surface so as to connect the first output terminal to the first electrode. The canceling line is designed to cancel electric charges generated at the connecting line in response to a change in a temperature of the pyroelectric substrate. The canceling line is constituted by an electrically conductive layer formed on the second surface so as to be not directly connected to the second electrode but to be electrically connected to the connecting line.

In the second aspect of the pyroelectric infrared detection element in accordance with the present invention, in addition to the first aspect of the pyroelectric infrared detection element, the canceling line is electrically connected to the connecting line so as to have the same potential as the connecting line.

In the third aspect of the pyroelectric infrared detection element in accordance with the present invention, in addition to the first or second aspect of the pyroelectric infrared detection element, the pyroelectric substrate has a first end and a second end in a first direction perpendicular to the thickness direction. The pyroelectric element is positioned in a center part of the pyroelectric substrate in the first direction. The first output terminal is formed at the first end. The second output terminal is formed at the second end.

In the fourth aspect of the pyroelectric infrared detection element in accordance with the present invention, in addition to any one of the first to third aspects of the pyroelectric infrared detection element, the canceling line is electrically connected to the connecting line via the first output terminal.

In the fifth aspect of the pyroelectric infrared detection element in accordance with the present invention, in addition to any one of the first to fourth aspects of the pyroelectric infrared detection element, the canceling line is formed opposite to the connecting line.

In the sixth aspect of the pyroelectric infrared detection element in accordance with the present invention, in addition to any one of the first to fifth aspects of the pyroelectric infrared detection element, the canceling line is designed to have the same width as the connecting line.

In the seventh aspect of the pyroelectric infrared detection element in accordance with the present invention, in addition to any one of the first to sixth aspects of the pyroelectric infrared detection element, the pyroelectric infrared detection element includes "N" of ("N" is even number and is equal to or more than 4) of the pyroelectric elements. The "N" of the pyroelectric elements are arranged in an "m" by "n" matrix manner (each of "m" and "n" is even number, and "m"*"n"=16).

In the eighth aspect of the pyroelectric infrared detection element in accordance with the present invention, in addition to any one of the first to seventh aspects of the pyroelectric infrared detection element, the pyroelectric infrared detection element further comprises a slit penetrating through the pyroelectric substrate in the thickness direction. The slit is designed to surround the infrared absorption part.

In the ninth aspect of the pyroelectric infrared detection element in accordance with the present invention, in addition to any one of the first to eighth aspects of the pyroelectric infrared detection element, the second wiring part includes a second connecting line and a second canceling line. The second connecting line is constituted by an electrically conductive layer formed on the second surface so as to connect the second output terminal to the second electrode. The second canceling line is designed to cancel electric charges generated at the second connecting line in response to a change in a temperature of the pyroelectric substrate. The second canceling line is constituted by an electrically conductive layer formed on the first surface so as to be not directly connected to the first electrode but to be electrically connected to the second connecting line.

The first aspect of the infrared sensor in accordance with the present invention includes a pyroelectric infrared detection element defined by any one of the first to ninth aspects of the pyroelectric infrared detection element.

In the second aspect of the infrared sensor in accordance with the present invention, in addition to the first aspect of the infrared sensor, the infrared sensor further includes a signal processing circuit, and a package. The signal processing circuit is configured to generate a signal indicative of predetermined information based on a current flowing between the first output terminal and the second output terminal. The package is configured to accommodate the pyroelectric infrared detection element and the signal processing circuit. The package is provided with a window part. The window part is designed to allow the pyroelectric element of the pyroelectric infrared detection element to receive infrared of a predetermined frequency. The window part is made of material which transmits infrared of the predetermined frequency.

BEST MODE FOR CARRYING OUT THE INVENTION (First Embodiment)

Figure 1:
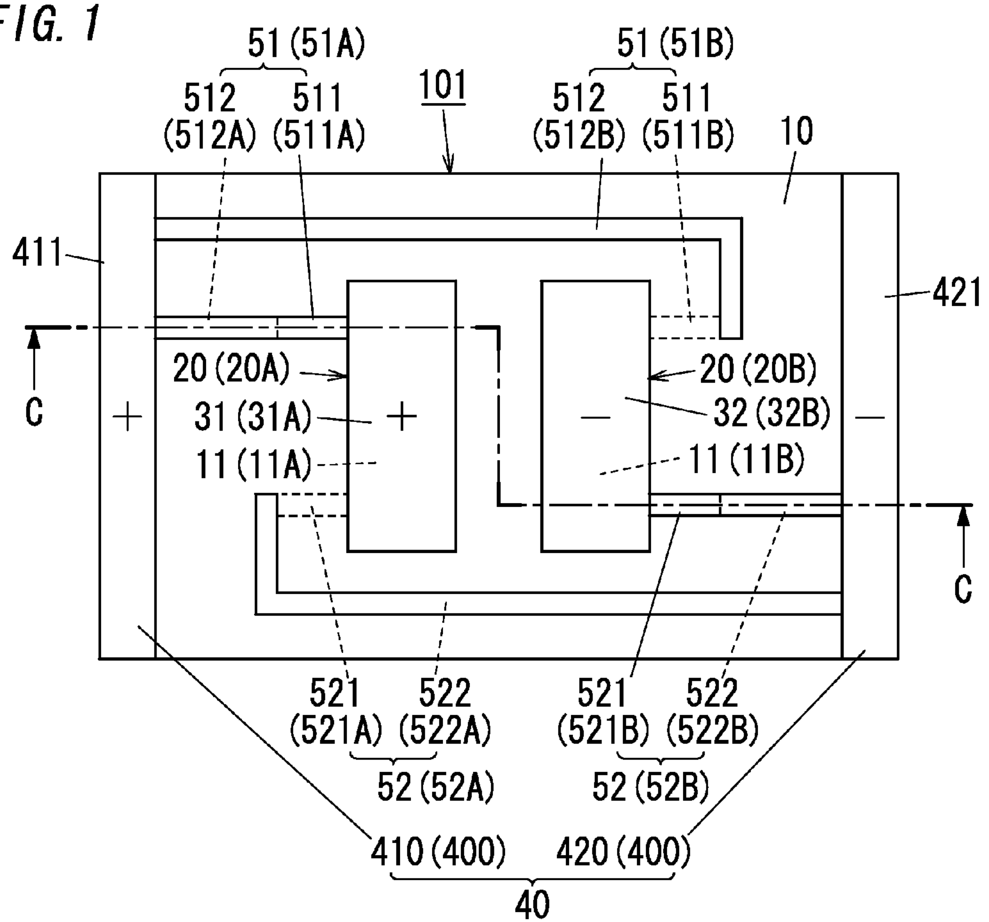
FIG. 1 is a plane view illustrating the upper surface of the pyroelectric infrared detection element of the first embodiment.
Figure 2:
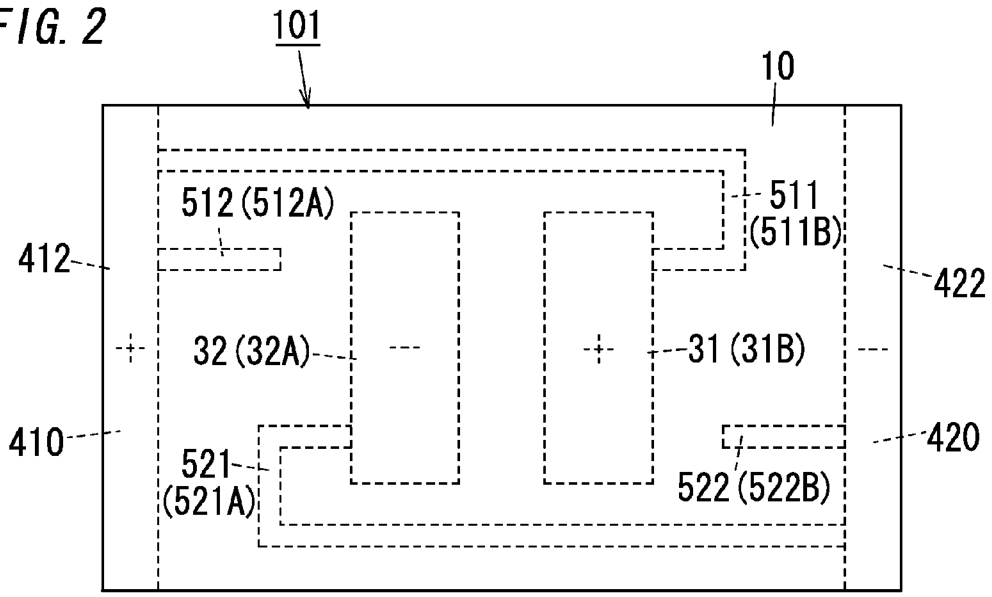
FIG. 2 is a plane view illustrating the lower surface of the pyroelectric infrared detection element of the first embodiment as seen from the above.
Figure 3:
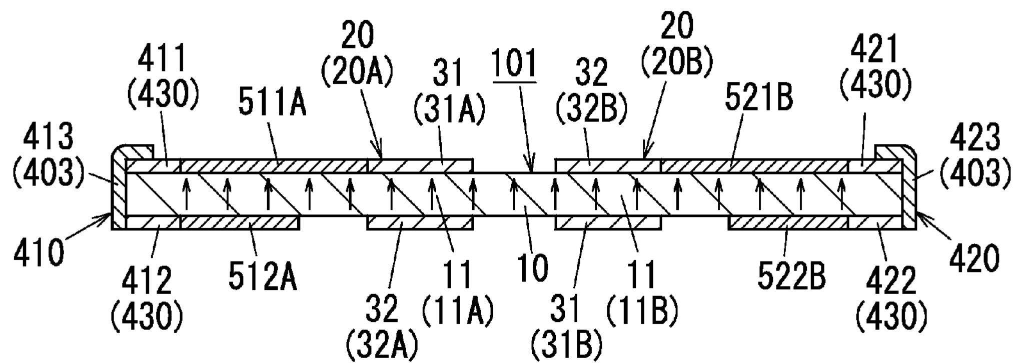
FIG. 3 is a cross sectional view taken along the line C-C of FIG. 1.

The following explanation referring FIG. 1 to FIG. 3 is made to the pyroelectric infrared detection element 101 of the present embodiment. FIG. 1 shows a plane view of the pyroelectric infrared detection element 101 viewed from a first surface side (upper surface side). FIG. 2 is a plane view illustrating the other surface (lower surface) of the pyroelectric infrared detection element 101 viewed from the first surface side through the pyroelectric infrared detection element 101. FIG. 3 shows a schematic cross sectional view of the pyroelectric infrared detection element 101 along the line C-C of FIG. 1.

The pyroelectric infrared detection element 101 of the present embodiment is formed by use of a substrate (pyroelectric substrate) 10 made of pyroelectric material.

As shown in FIG. 1 to FIG. 3, the pyroelectric substrate 10 of the present embodiment includes pyroelectric elements (light receiving parts) 20. The pyroelectric element 20 includes an electrode (first electrode) 31, an electrode (second electrode) 32 opposite to the first electrode 31, and an infrared absorption part 11 having pyroelectric properties and interposed between the first electrode 31 and the second electrode 32. When there is no need to distinguish the first electrode 31 and the second electrode 32 from each other, the first electrode 31 and the second electrode 32 are respectively represented as the electrode 30.

The first electrode 31 is formed on a first surface of the pyroelectric substrate 10 in a thickness direction. The second electrode 32 is formed on a second surface of the pyroelectric substrate 10 in a thickness direction. The infrared absorption part 11 is defined as a part of the pyroelectric substrate 10 interposed between the first electrode 31 and the second electrode 32.

The pyroelectric infrared detection element 101 includes an output terminal unit 40 used for extracting a current generated by the pyroelectric element 20 in response to a temperature variation. The output terminal unit 40 includes an output terminal (first output terminal) 410 and an output terminal (second output terminal) 420.

The first output terminal 410 is formed at a first end (a left end in FIG. 1) of the pyroelectric substrate 10 in a first direction (a lateral direction in FIG. 1) perpendicular to the thickness direction of the pyroelectric substrate 10. The first output terminal 410 includes a conductor pattern part 411 formed at the first end on the upper surface of the pyroelectric substrate 10, a conductor pattern part 412 formed at the first end on the lower surface of the pyroelectric substrate 10, and a connection part 413 designed to connect the conductor pattern part 412 and the connection part 413 to each other.

The second output terminal 420 is formed at a second end (a right end in FIG. 1) of the pyroelectric substrate 10 in the first direction (the lateral direction in FIG. 1). The second output terminal 420 includes a conductor pattern part 421 formed at the second end on the upper surface of the pyroelectric substrate 10, a conductor pattern part 422 formed at the second end on the lower surface of the pyroelectric substrate 10, and a connection part 423 designed to connect the conductor pattern part 422 and the connection part 423 to each other.

Besides, when there is no need to distinguish the first output terminal 410 and the second output terminal 420 from each other, the first output terminal 410 and the second output terminal 420 are respectively represented as the output terminal 400. When there is no need to distinguish the conductor pattern parts 411, 412, 421, and 422 from each other, the conductor pattern parts 411, 412, 421, and 422 are respectively represented as the conductor pattern part 430. When there is no need to distinguish the connection parts 413 and 423 from each other, the connection parts 413 and 423 are respectively represented as the connection part 403.

Further, the pyroelectric infrared detection element 101 includes a wiring part (first wiring part) 51 designed to connect the first output terminal 410 to the first electrode 31 of the pyroelectric element 20, and a wiring part (second wiring part) 52 designed to connect the second output terminal 420 to the second electrode 32 of the pyroelectric element 20.

The first wiring part 51 includes a connecting line (first connecting line) 511 and a canceling line (first canceling line) 512. The first connecting line 511 is constituted by an electrically conductive layer formed on the first surface of the pyroelectric substrate 10 so as to connect the first output terminal 410 to the first electrode 31. The first canceling line 512 is designed to cancel electric charges generated at the connecting line (first connecting line) 511 in response to a change in a temperature of the pyroelectric substrate 10. The canceling line (first canceling line) 512 is constituted by an electrically conductive layer formed on the second surface of the pyroelectric substrate 10 so as to be not directly connected to the second electrode 32 but to be electrically connected to the connecting line (first connecting line) 511.

The second wiring part 52 includes a connecting line (second connecting line) 521 and a canceling line (second canceling line) 522. The second connecting line 521 is constituted by an electrically conductive layer formed on the second surface of the pyroelectric substrate 10 so as to connect the second output terminal 420 to the second electrode 32. The second canceling line 522 is designed to cancel electric charges generated at the connecting line (second connecting line) 521 in response to a change in the temperature of the pyroelectric substrate 10. The canceling line (second canceling line) 522 is constituted by an electrically conductive layer formed on the first surface of the pyroelectric substrate 10 so as to be not directly connected to the first electrode 31 but to be electrically connected to the connecting line (second connecting line) 521.

Besides, when there is no need to distinguish the first wiring part 51 and the second wiring part 52 from each other, the first wiring part 51 and the second wiring part 52 are respectively represented as the wiring part 50. Further, when there is no need to distinguish the connecting liens 511 and 521 from each other, the connecting lines 511 and 521 are respectively represented as the connecting line 501. Similarly, when there is no need to distinguish the canceling lines 512 and 522 from each other, the canceling lines 512 and 522 are respectively represented as the canceling line 502.

The pyroelectric infrared detection element 101 of the present embodiment includes the two pyroelectric elements 20. In order to distinguish the two pyroelectric elements 20 from each other, if necessary, a suffix "A" is attached to the reference numerals of one pyroelectric element (pyroelectric element on the left side in FIG. 1) and components belonging thereto, and a suffix "B" is attached to the reference numerals of the other pyroelectric element (pyroelectric element on the right side in FIG. 1) and components belonging thereto.

As needed, the suffix "A" is attached to the reference numerals of the wiring part 50 connected to the output terminal unit 40 of the pyroelectric element 20A and components belonging thereto, and the suffix "B" is attached to the reference numerals of the wiring part 50 connected to the output terminal unit 40 of the pyroelectric element 20B and components belonging thereto.

The following explanation is made to the pyroelectric element 20A. The first electrode 31A is formed on the upper surface (upper surface in FIG. 3) of the pyroelectric substrate 10. The second electrode 32A is formed on the lower surface (lower surface in FIG. 3) of the pyroelectric substrate 10. The infrared absorption part 11A is a part of the pyroelectric substrate 10 interposed between the first electrode 31A and the second electrode 32A. With regard to the pyroelectric element 20A, the upper surface of the pyroelectric substrate 10 defines the first surface, and the lower surface of the pyroelectric substrate 10 defines the second surface.

The pyroelectric element 20A is connected to the output terminal unit 40 via the first wiring part 51A and the second wiring part 52A.

As shown in FIG. 1, the first connecting line 511A is formed on the upper surface of the pyroelectric substrate 10 so as to connect the conductor pattern part 411 of the first output terminal 410 to the first electrode 31A. The first canceling line 512A is formed on the lower surface of the pyroelectric substrate 10 in such a manner to be opposite to the first connecting line 511A. Notably, as shown in FIG. 2, the first canceling line 512A is not directly connected to the second electrode 32A. In other words, the first canceling line 512A is electrically insulated from the second electrode 32A.

Further, the first canceling line 512A is connected to the conductor pattern part 412 of the first output terminal 410. Hence, the first canceling line 512A is electrically connected to the first connecting line 511A via the first output terminal 410.

As shown in FIG. 2, the second connecting line 521A is formed on the lower surface of the pyroelectric substrate 10 so as to connect the conductor pattern part 422 of the second output terminal 420 to the second electrode 32A. As shown in FIG. 1, the second canceling line 522A is formed on the upper surface of the pyroelectric substrate 10 in such a manner to be opposite to the second connecting line 521A. Notably, the second canceling line 522A is not directly connected to the first electrode 31A. In other words, the second canceling line 522A is electrically insulated from the first electrode 31A. Further, the second canceling line 522A is connected to the conductor pattern part 421 of the second output terminal 420. Hence, the second canceling line 522A is electrically connected to the second connecting line 521A via the second output terminal 420.

The following explanation is made to the pyroelectric element 20B. The first electrode 31B is formed on the lower surface (lower surface in FIG. 3) of the pyroelectric substrate 10. The second electrode 32B is formed on the upper surface (upper surface in FIG. 3) of the pyroelectric substrate 10. The infrared absorption part 11B is a part of the pyroelectric substrate 10 interposed between the first electrode 31B and the second electrode 32B. With regard to the pyroelectric element 20B, the lower surface of the pyroelectric substrate 10 defines the first surface, and the upper surface of the pyroelectric substrate 10 defines the second surface.

The pyroelectric element 20B is connected to the output terminal unit 40 via the first wiring part 51B and the second wiring part 52B.

As shown in FIG. 2, the first connecting line 511B is formed on the lower surface of the pyroelectric substrate 10 so as to connect the conductor pattern part 412 of the first output terminal 410 to the first electrode 31B. As shown in FIG. 1, the first canceling line 512B is formed on the upper surface of the pyroelectric substrate 10 in such a manner to be opposite to the first connecting line 511B. Notably, the first canceling line 512B is not directly connected to the second electrode 32B. Further, the first canceling line 512B is connected to the conductor pattern part 411 via the first output terminal 410.

As shown in FIG. 1, the second connecting line 521B is formed on the upper surface of the pyroelectric substrate 10 so as to connect the conductor pattern part 421 of the second output terminal 420 to the second electrode 32B. The second canceling line 522B is formed on the lower surface of the pyroelectric substrate 10 in such a manner to be opposite to the second connecting line 521B. Notably, the second canceling line 522B is not directly connected to the first electrode 31B. Further, the second canceling line 522B is connected to the conductor pattern part 422 of the second output terminal 420.

In other words, in the pyroelectric infrared detection element 101, the two light receiving parts (pyroelectric elements) 20 are formed at the center of the pyroelectric substrate 10, and the output terminals 400 are formed at the respective opposite ends of the pyroelectric substrate 10. In this arrangement, each of the light receiving parts 20 is constituted by the paired two electrodes 30 formed on the respective opposite surfaces (the above first surface and the second surface) of the pyroelectric substrate 10 in the thickness direction so as to be opposite to each other, and the part 11 of the pyroelectric substrate 10 positioned between the paired two electrodes 30.

In the pyroelectric infrared detection element 101 of the present embodiment, the pyroelectric substrate 10 is shaped into a rectangular plate. The two light receiving parts 20 are arranged along a lengthwise direction (the first direction) of the pyroelectric substrate 10 at the center part of the pyroelectric substrate 10 in the lengthwise direction. The output terminals 400 are formed at the respective opposite ends of the pyroelectric substrate 10 in the lengthwise direction. Further, each electrode 30 has a rectangular shape, and is formed to have its lengthwise direction aligned with the width direction of the pyroelectric substrate 10. Further, each electrode 30 is formed at the center part of the pyroelectric substrate 10 in the width direction. The pyroelectric substrate 10 has a direction of spontaneous polarization which is a direction extending along the thickness direction of the pyroelectric substrate 10, that is, an upward direction of FIG. 3 (a direction designated by an arrow in FIG. 3). Hence, with regard to the pyroelectric element 20A, the first electrode 31A defines the positive electrode, and the second electrode 32A defines the negative electrode. With regard to the pyroelectric element 20B, the first electrode 31B defines the negative electrode, and the second electrode 32B defines the positive electrode. The first electrodes 31A and 31B are connected to the first output terminal 410, and the second electrodes 32A and 32B are connected to the second output terminal 420. The two pyroelectric elements 20A and 20B are therefore connected in anti-parallel with each other.

Further, in the pyroelectric infrared detection element 101, the connecting line 501 for connecting the output terminal 400 to the electrode 30 of the pyroelectric element 20 is formed on each of the opposite surfaces of the pyroelectric substrate 10 in the thickness direction. One connecting line 501 (511A, 521B) of the two connecting lines 501 connected to the respective paired two electrodes 30 of the pyroelectric element 20 is formed into a straight shape, and the other connecting line 501 (511B, 521A) is formed into a reverse-J shape so as not to be in contact with the other pyroelectric element 20.

The output terminal 400 is constituted by the paired two conductor pattern parts 430 formed on the respective opposite surfaces of the pyroelectric substrate 10 in the thickness direction so as to be opposite to each other, and the connection part 403 (see FIG. 3) electrically connecting the paired conductor pattern parts 430 to each other. In this pyroelectric infrared detection element 101, the pyroelectric substrate 10 is made of a single-crystal $LiTaO_3$ substrate. Each electrode 30, each wiring part 50, and each conductor pattern part 430 are constituted by thin films made of infrared absorption material (e.g., NiCr). Each connection part 403 is made of electrically conductive adhesive.

The pyroelectric infrared detection element 101 of the present embodiment is a dual-type pyroelectric infrared detection element including the two light receiving parts 20. As shown in an equivalent circuit diagram illustrated in FIG. 4, the two light receiving parts 20 are connected in anti-parallel with each other. In other words, the light receiving part 20 is considered as an electrically polarized capacitor, and the two light receiving parts 20 are connected in parallel with reverse polarity. Besides, the symbol "+" or "−" attached to each electrode 30 in FIG. 1 and FIG. 2 indicates polarity of a corresponding electrode 30, wherein the left output terminal (first output terminal) 410 has the positive polarity and the right output terminal (second output terminal) 420 has the negative polarity. In FIG. 1 and FIG. 2, the symbols "+" and "−" are used for indicating which electrode 30 is connected to which output terminal 400, but are not used for indicating polarity of a corresponding pyroelectric element 20.

Further, the pyroelectric infrared detection element 101 is provided with the canceling lines (dummy lines) 502 at the respective opposite surfaces of the pyroelectric substrate 10, and each canceling line 502 is formed on an opposite surface of the pyroelectric substrate 10 from a connecting line 501 to be paired with this connecting line 501. Each canceling line 502 is constituted by a thin film made of infrared absorption material (e.g., NiCr). Each canceling line 502 is not directly connected to the light receiving part 20 but is connected to a site having the same electric potential as a corresponding connecting line 501. In the pyroelectric infrared detection element 101, the electrodes 30 (31A and 32B), the connecting lines 501 (511A and 521B), the conductor pattern parts 430 (411 and 421), and the canceling lines 502 (512B and 522A) on the first surface of the pyroelectric substrate 10 are formed simultaneously by means of a deposition method or a sputtering method. Further, in the pyroelectric infrared detection element 101, the electrodes 30 (31B and 32A), the connecting lines 501 (511B and 521A), the conductor pattern parts 430 (412 and 422), and the canceling lines 502 (512A and 522B) on the second surface of the pyroelectric substrate 10 are formed simultaneously. The canceling line 502 is connected to the output terminal to which the corresponding connecting line 501 is connected, thereby having the same electric potential as the corresponding connecting line 501. More specifically, with regard to the connecting line 501 and the canceling line 502 in a pair, the connecting line 501 is formed integrally with one conductor pattern part 430 of the paired conductor pattern parts 430 and 430 of the output terminal 400 and the electrode 30 connected to this connecting line 501, thereby being electrically connected to one conductor pattern part 430 and the electrode 30. The canceling line 502 is formed integrally with the other conductor pattern part 430 of the paired conductor pattern parts 430 and 430 of the output terminal 400, thereby being electrically connected to the other conductor pattern part 430.

Further, in the pyroelectric infrared detection element 101, the connecting line 501 and the canceling line 502 in the pair are arranged opposite to each other. Moreover, the connecting line 501 and the canceling line 502 in the pair have the same width.

Further, in the pyroelectric infrared detection element 101, with respect to each of the opposite surfaces of the pyroelectric substrate 10 in the thickness direction, the electrodes 30, the connecting lines 501, the conductor pattern parts 430, and the canceling lines 502 are arranged with twofold rotational symmetry with regard to a symmetrical axis passing through the center of the pyroelectric substrate 10.

Moreover, in the pyroelectric infrared detection element 101, the canceling line 502 is formed such that the canceling line 502 and the connecting line 501 are arranged in approximate plane-symmetry with respect to a surface perpendicular to the thickness direction of the pyroelectric substrate 10. Besides, in this arrangement, a part of the connecting line 501 other than an end of the connecting line 501 close to the electrode 30 is plane-symmetrical to the canceling line 502.

It is preferable that the canceling line 502 is formed such that the canceling line 502 and the connecting line 501 are arranged in plane-symmetry with respect to a surface perpendicular to the thickness direction of the pyroelectric substrate 10. However, it is sufficient that the canceling line 502 is connected to a site having the same electric potential as the connecting line 501. Hence, the canceling line 502 and the connecting line 501 are not necessarily plane-symmetrical to each other.

Preferably, the connecting line 501 and the canceling line 502 have the same width, but may have the approximately same width. Alternatively, the canceling line 502 may have a width broader or narrower than that of the connecting line 501.

Figure 4:
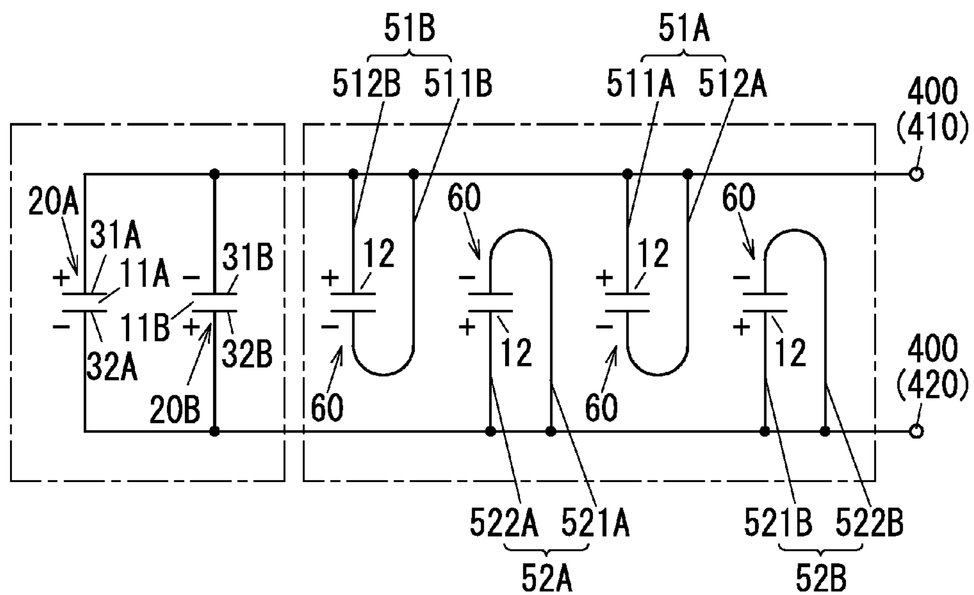
FIG. 4 is an equivalent circuit diagram of the pyroelectric infrared detection element of the first embodiment.

As mentioned in the above, FIG. 4 shows the equivalent circuit diagram of the pyroelectric infrared detection element 101 explained above. In this equivalent circuit diagram, each of four capacitors 60 respectively including the four connecting lines 501 as their components has its opposite ends connected to any one of the two output terminals 400. Besides, each capacitor 60 is defined as a parasitic capacitor constituted by the connecting line 501, the canceling line 502 paired with this connecting line 501, and the part 12 (see FIG. 3) of the pyroelectric substrate 10 between the connecting line 501 and the canceling line 502. Hence, the two capacitors 60 of the four capacitors 60 are connected to one output terminal 400, and the remaining two capacitors 60 are connected to the other output terminal 400. Moreover, in FIG. 4, the symbols "+" and "−" indicate polarity for each of the light receiving parts 20 and the capacitors 60.

The material of the pyroelectric substrate 10 is not limited to $LiTaO_3$, but may be selected from, for example, the other single-crystal material (e.g., $LiNbO_3$), ceramic material (e.g., $PbTiO_3$, PZT, PZT-PMN (: $Pb(Zr,Ti)O_3$—$Pb(Mn,Nb)O_3$), and high-polymer material (e.g., $PVF_2$). Further, the above infrared absorption material is not limited to NiCr, but may be selected from Ni and gold black, for example.

Figure 8:
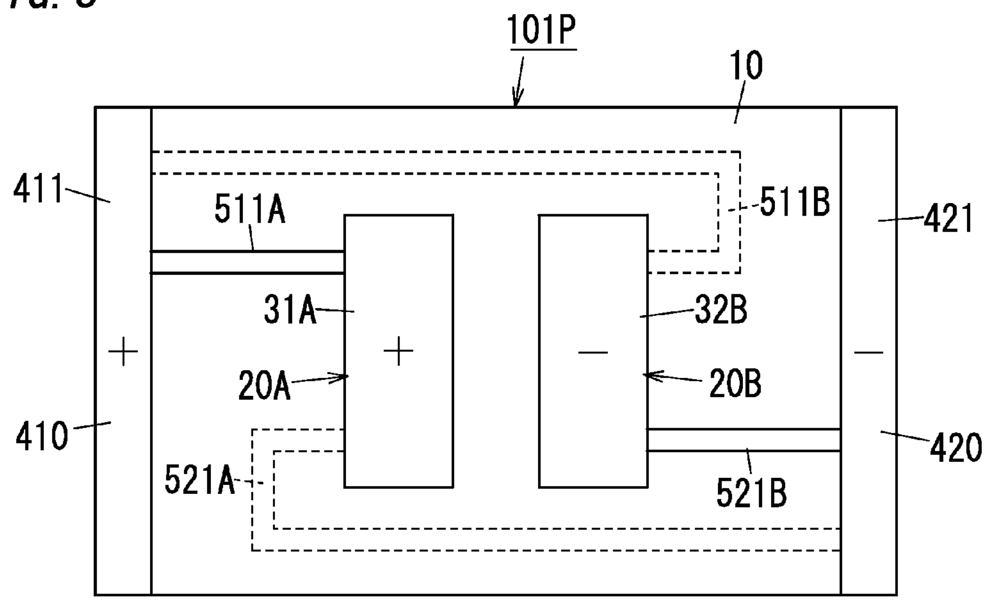
FIG. 8 is a plane view illustrating the upper surface of the pyroelectric infrared detection element of the first comparative example.
Figure 9:
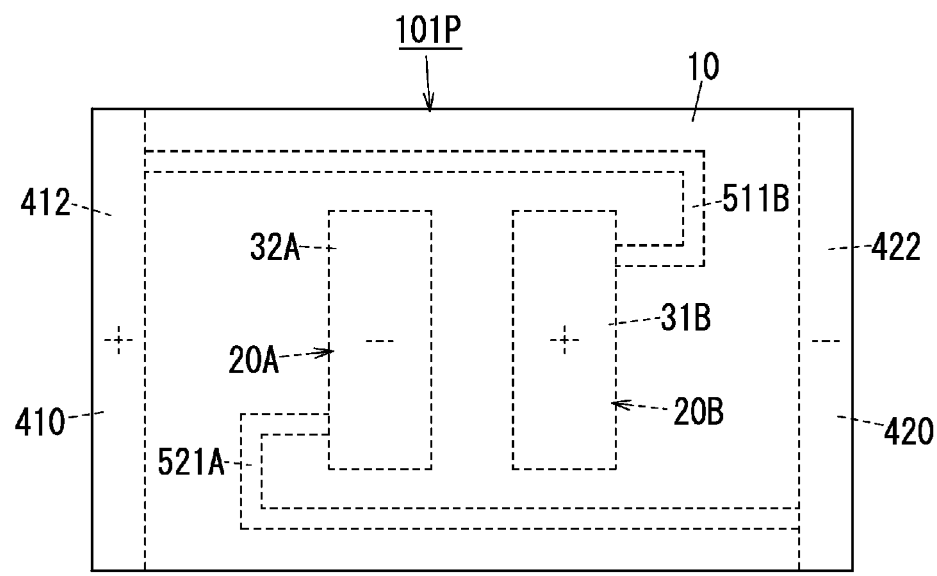
FIG. 9 is a plane view illustrating the lower surface of the pyroelectric infrared detection element of the first comparative example as seen from the above.

Before an explanation is made to an advantage resulting from provision of the canceling line 502 to the pyroelectric infrared detection element 101 of the present embodiment, the pyroelectric infrared detection element 101P of the first comparative example is explained. As illustrated in FIG. 8 and FIG. 9, the pyroelectric infrared detection element 101P of the first comparative example has the same configuration as that illustrated in FIG. 1, but is devoid of the canceling line 502. In brief, the pyroelectric infrared detection element 101P of the first comparative example includes the wiring part 50 constituted by only the connecting line 501.

Figure 10:
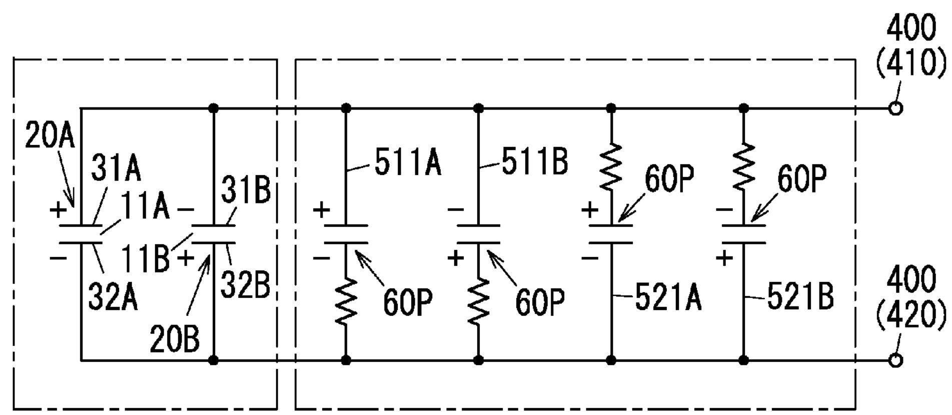
FIG. 10 is an equivalent circuit diagram of the pyroelectric infrared detection element of the first comparative example.

As illustrated in an equivalent circuit diagram of FIG. 10, also in the pyroelectric infrared detection element 101P of the first comparative example, the two light receiving parts 20 are connected in anti-parallel with each other. As shown in FIG. 10, in the equivalent circuit diagram of the pyroelectric infrared detection element 101P of the first comparative example, each of four capacitors 60P respectively including the four connecting lines 501 (511A, 511B, 521A, and 521B) as their components is connected between the paired output terminals 410 and 420. Each of the capacitors 60P is constituted by the connecting line 501, the pyroelectric substrate 10, and the conductor pattern part 430, wherein this conductor pattern part 430 is formed on the opposite surface of the pyroelectric substrate 10 from this connecting line 501 of the paired conductor pattern parts 430 and 430 of the output terminal 400 different from the output terminal 400 connected to this connecting line 501.

Figure 11:
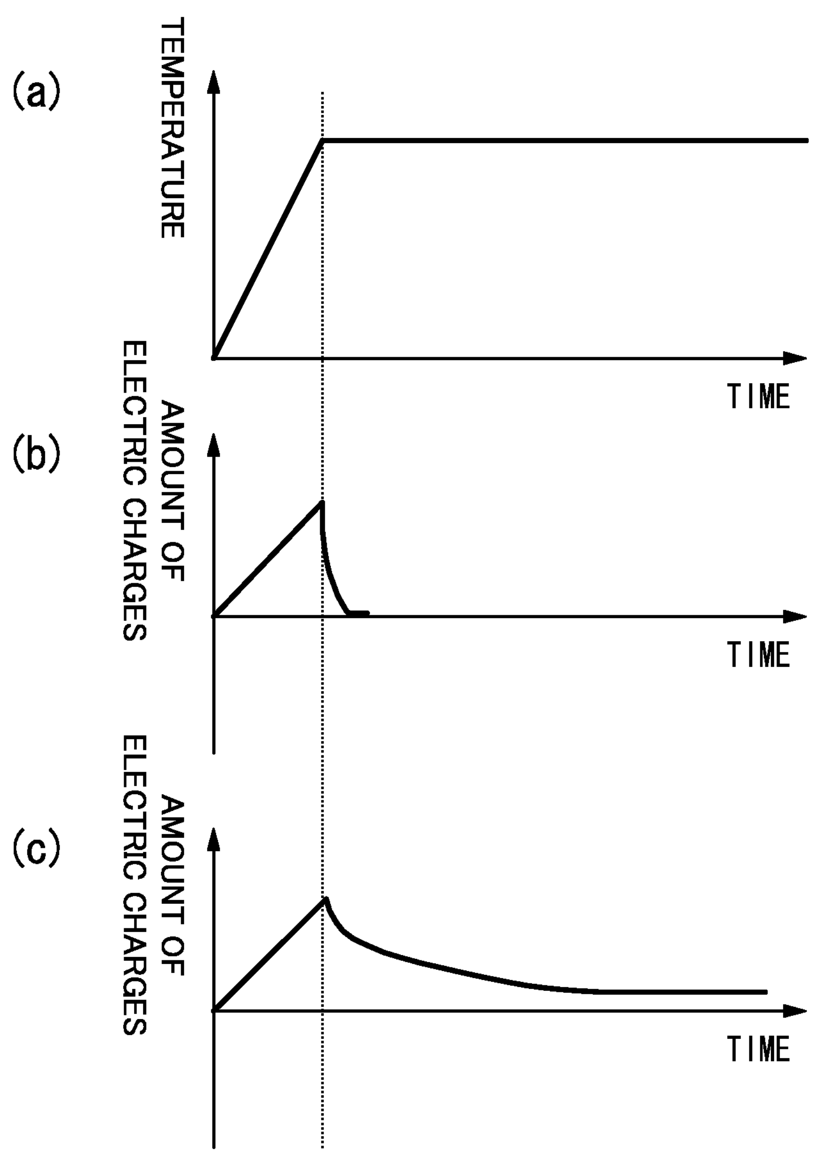
FIG. 11 is an explanation view of an operation of the pyroelectric infrared detection element of the first comparative example.
Figure 12:
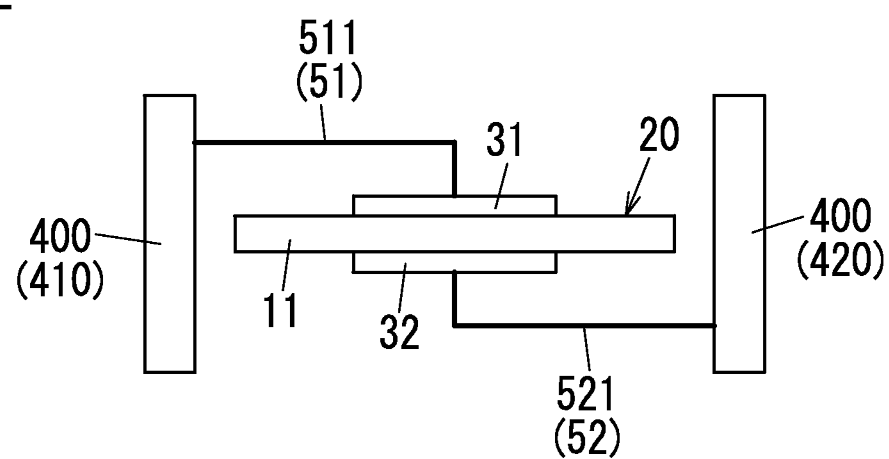
FIG. 12 is an explanation view of an operation of the pyroelectric infrared detection element of the first comparative example.
Figure 13:
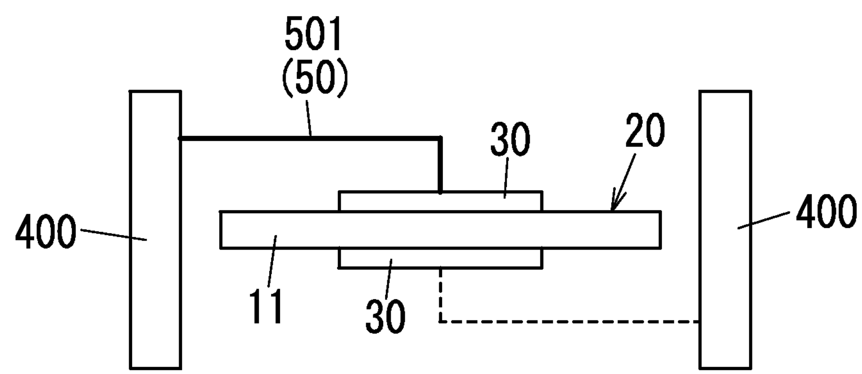
FIG. 13 is an explanation view of an operation of the pyroelectric infrared detection element of the first comparative example.

The following explanation referring FIG. 11 to FIG. 13 is made to a time variation of electric charges generated when the temperature of the pyroelectric substrate 10 of the pyroelectric infrared detection element 101P of the first comparative example is increased as illustrated in FIG. 11(*a*).

In response to a change in the temperature of the pyroelectric substrate 10, electric charges are generated in the pyroelectric substrate 10. The electric charges generated in the pyroelectric substrate 10 include electric charges generated at the light receiving part 20. Such electric charges generated at the light receiving part 20 are discharged to the output terminals 410 and 420 via the connecting lines 511 and 521 connected to the light receiving part 20 as shown in a schematic diagram illustrated in FIG. 12. Hence, when there is no change in the temperature, the electric charges generated at the light receiving part 20 are disappeared immediately (reduced at a short time constant) as shown in FIG. 11(*b*). In contrast, as shown in a schematic diagram illustrated in FIG. 13, electric charges generated at the wiring part 50 (the connecting line 501) are discharged to the output terminal 400 to which this connecting line 501 is connected. Such discharged electric charges are outputted, as an output current, to a current-voltage conversion circuit which is an external circuit. In this arrangement, the connecting line 501 is formed on only one surface of the opposite surfaces of the pyroelectric substrate 10 in the thickness direction. Hence, discharge time of electric charges generated on the other surface of the pyroelectric substrate 10 is determined (controlled) by surface resistance (sheet resistance) of the pyroelectric substrate 10. Since the surface resistance of the pyroelectric substrate 10 is very high, a time constant defining time for the electric charges generated at the connecting line 501 to disappear becomes greater as shown in FIG. 11 (*c*). As explained in the above, the electric charges generated at the wiring part 50 resulting from a temperature variation of surrounding environment are outputted, as an output current (i.e., a signal), via the output terminal unit 40.

Figure 5:
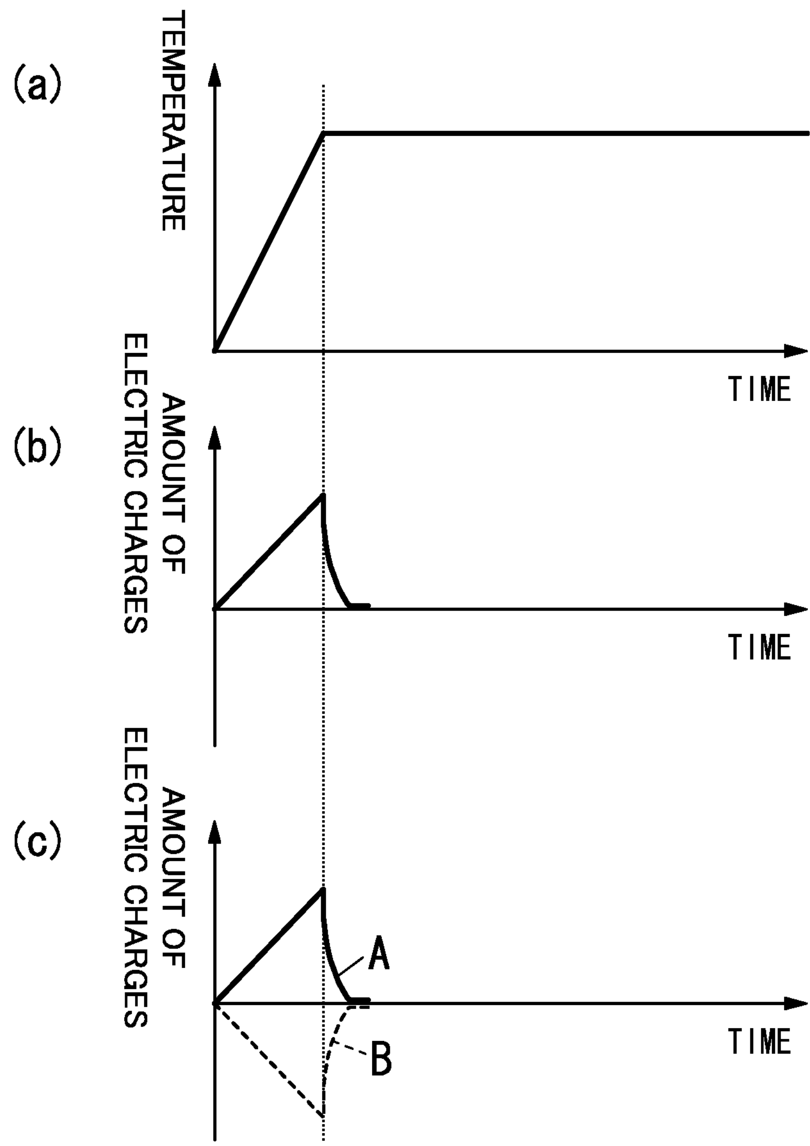
FIG. 5 is an explanation view of an operation of the pyroelectric infrared detection element of the first embodiment.
Figure 6:
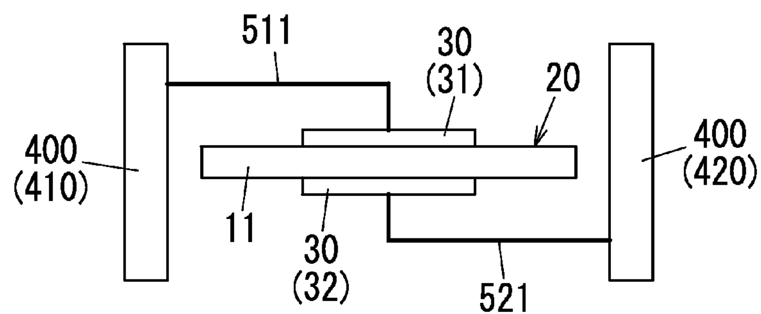
FIG. 6 is an explanation view of an operation of the pyroelectric infrared detection element of the first embodiment.
Figure 7:
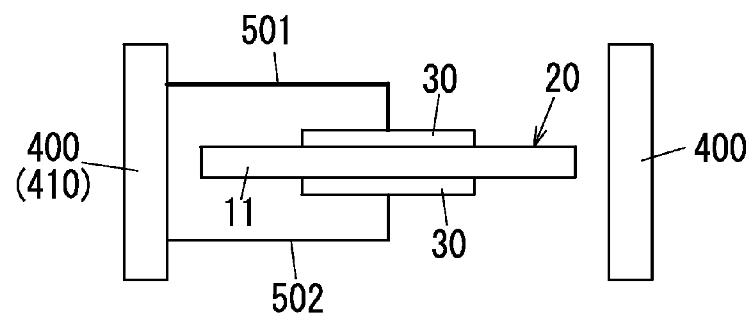
FIG. 7 is an explanation view of an operation of the pyroelectric infrared detection element of the first embodiment.

Next, the following explanation referring FIG. 5 to FIG. 7 is made to a time variation of electric charges generated when the temperature of the pyroelectric substrate 10 of the pyroelectric infrared detection element 101 of the present embodiment is increased as illustrated in FIG. 5(*a*).

In response to a change in the temperature of the pyroelectric substrate 10, electric charges are generated in the pyroelectric substrate 10. The electric charges generated in the pyroelectric substrate 10 include electric charges generated at the light receiving part 20. Such electric charges generated at the light receiving part 20 are discharged to the output terminals 410 and 420 via the connecting lines 511 and 521 connected to the light receiving part 20 as shown in a schematic diagram illustrated in FIG. 6. Hence, when there is no change in the temperature, the electric charges generated at the light receiving part 20 are disappeared immediately (reduced at a short time constant) as shown in FIG. 5(*b*).

In contrast, as shown in a schematic diagram illustrated in FIG. 7, electric charges generated at the connecting line 501 and the canceling line 502 associated with this connecting line 501 are discharged to the output terminal 400 to which this connecting line 501 and this canceling line 502 are connected. Hence, as shown in FIG. 5(*c*), such electric charges are disappeared instantaneously (reduced at a short time constant). With regard to the pyroelectric infrared detection element 101 of the present embodiment, the electric charges generated at the connecting line 501 and the electric charges generated at the canceling line 502 have different polarity, and the electric charges having the different polarity are discharged to the output terminal 400 with the same electric potential at the approximately same time constant. Consequently, the electric charges generated at the connecting line 501 and the electric charges generated at the canceling line 502 cancel each other out. Hence, it is possible to prevent such electric charges from being outputted as an output current. Besides, in FIG. 5(*c*), a curve "A" expresses a time variation of the electric charges generated at the connecting line 501, and a curve "B" expresses a time variation of the electric charges generated at the canceling line 502.

The pyroelectric infrared detection element 101 of the present embodiment explained in the above includes the light receiving part 20, the paired output terminals 400 and 400, and the paired two connecting lines 501 and 501. The light receiving part 20 is constituted by the pair of the two electrodes 30 and 30 and the part 11 of the pyroelectric substrate 10 interposed between the paired two electrodes 30 and 30. The two electrodes 30 and 30 are formed on the respective opposite surfaces of the pyroelectric substrate 10 in the thickness direction so as to be opposite to each other. The paired output terminals 400 and 400 are formed at the respective opposite ends of the pyroelectric substrate 10. The paired two connecting lines 501 and 501 are formed on the opposite surfaces of the pyroelectric substrate 10 so as to connect the respective paired output terminals 400 and 400 to the light receiving part 20. Formed on the respective opposite surfaces of the pyroelectric substrate 10 are the canceling lines 502. The canceling line 501 is associated with the connecting line 501 and is formed on the opposite surface of the pyroelectric substrate 10 from the associated connecting line 501. The canceling line 502 is not connected directly to the light receiving part 20, but is connected to a site having the same electric potential as the associated connecting line 501.

In other words, the pyroelectric infrared detection element 101 of the present embodiment includes the pyroelectric element (light receiving part) 20, the output terminal unit 40, the first wiring part 51, and the second wiring part 52. The pyroelectric element 20 includes the first electrode 31, the second electrode 32 opposite to the first electrode 31, and the infrared absorption part 11 having pyroelectric properties and interposed between the first electrode 31 and the second electrode 32. The output terminal unit 40 includes the first output terminal 410 and the second output terminal 420 used for extracting a current generated by the pyroelectric element 20 in response to a change in a temperature. The first wiring part 51 is designed to connect the first output terminal 410 to the first electrode 31. The second wiring part 52 is designed to connect the second output terminal 420 to the second electrode 32. The first electrode 31 is formed on the first surface of the pyroelectric substrate 10 made of pyroelectric material in the thickness direction. The second electrode 32 is formed on the second surface of the pyroelectric substrate 10 in the thickness direction. The infrared absorption part 11 is defined as a part of the pyroelectric substrate 10 interposed between the first electrode 31 and the second electrode 32. The first output terminal 410 and the second output terminal 420 are formed on the pyroelectric substrate 10.

The first wiring part 51 includes the (first) connecting line 511 and the (first) canceling line 512. The first connecting line 511 is constituted by an electrically conductive layer formed on the first surface so as to connect the first output terminal 410 to the first electrode 31. The first canceling line 512 is designed to cancel electric charges generated at the connecting line 511 in response to a change in the temperature of the pyroelectric substrate 10. The first canceling line 512 is constituted by an electrically conductive layer formed on the second surface so as to be not directly connected to the second electrode 32 but to be electrically connected to the first connecting line 511.

The second wiring part 52 includes the second connecting line 521 and the second canceling line 522. The second connecting line 521 is constituted by an electrically conductive layer formed on the second surface so as to connect the second output terminal 420 to the second electrode 32. The second canceling line 522 is designed to cancel electric charges generated at the second connecting line 521 in response to a change in the temperature of the pyroelectric substrate 10. The second canceling line 522 is constituted by an electrically conductive layer formed on the first surface so as to be not directly connected to the first electrode 31 but to be electrically connected to the second connecting line 521.

Consequently, the pyroelectric infrared detection element 101 of the present embodiment can neutralize the electric charges generated at the connecting line 501 by the electric charges generated at the canceling line 502. Hence, the pyroelectric infrared detection element 101 of the present embodiment can suppress the electric charges caused by a temperature variation of the surrounding environment from being outputted via the respective output terminals 400, without deteriorating the pyroelectric performance of the pyroelectric substrate 10.

Besides, the pyroelectric substrate 10 has the first end and the second end in the first direction (the lengthwise direction in the present embodiment) perpendicular to the thickness direction thereof. The pyroelectric element 20 is positioned in a center part of the pyroelectric substrate 10 in the first direction. The first output terminal 410 is formed at the first end, and the second output terminal 420 is formed at the second end.

Further, in the pyroelectric substrate 10 of the present embodiment, the first wiring part 51 and the second wiring part 52 include the respective canceling lines 502. However, it is sufficient that at least one of the first wiring part 51 and the second wiring part 52 includes the canceling line 502. Notably, it is preferable that the first wiring part 51 and the second wiring part 52 include the respective canceling lines 502.

Moreover, the pyroelectric infrared detection element 101 of the present embodiment includes the two pyroelectric elements 20A and 20B connected in anti-parallel with each other. In brief, the pyroelectric infrared detection element 101 of the present embodiment is a dual element device. Hence, when the temperature change occurs at the entire pyroelectric infrared detection element 101, the electric charges generated as the light receiving part 20 is not outputted via the output terminal unit 40 as the output current. It is therefore possible to more suppress the flow of the output current caused by the temperature change of the surrounding environment.

Further, in the pyroelectric infrared detection element 101 of the present embodiment, the canceling line 502 (512A, 512B, 522A, 522B) is electrically connected to the connecting line 501 (511A, 511B, 521A, 521B) so as to have the same potential as the connecting line 501 (511A, 511B, 521A, 521B). Especially, the first canceling line 512 is electrically connected to the first connecting line 511 via the first output terminal 410. Further, the second canceling line 522 is electrically connected to the second connecting line 521 via the second output terminal 420. In brief, in the pyroelectric infrared detection element 101 of the present embodiment, the connecting line 501 and the canceling line 502 are connected to the output terminal unit 40 to have the same potential. Hence, it is possible to connect the connecting line 501 to the canceling line 502 along the shortest path from the connecting line 501 to the canceling line 502.

Moreover, in the pyroelectric infrared detection element 101 of the present embodiment, the canceling line 502 is formed opposite to the connecting line 501. For example, the first canceling lines 512A and 512B are formed opposite to the respective first connecting lines 511A and 511B. The second canceling lines 522A and 522B are formed opposite to the respective second connecting lines 521A and 521B.

In other words, in the pyroelectric infrared detection element 101 of the present embodiment, the connecting line 501 and the canceling line 502 in the pair are arranged opposite to each other. Hence, the electric charges generated at the connecting line 501 are discharged rapidly irrespective of the surface resistance of the pyroelectric substrate 10. In brief, as mentioned in the above, with forming the canceling line 502 such that the canceling line 502 and the connecting line 501 are arranged in approximate plane-symmetry with respect to a surface perpendicular to the thickness direction of the pyroelectric substrate 10, the electric charges generated at the connecting line 501 resulting from a change in the temperature of the surrounding environment are instantaneously discharged irrespective of the surface resistance of the pyroelectric substrate 10.

Additionally, in the pyroelectric infrared detection element 101 of the present embodiment, the canceling line 502 is formed to have the same width as the connecting line 501. For example, the first canceling lines 512A and 512B have the same widths as the first connecting lines 511A and 511B, respectively. The second canceling lines 522A and 522B have the same widths as the second connecting lines 521A and 521B, respectively.

In other words, in the pyroelectric infrared detection element 101 of the present embodiment, the connecting line 501 and the canceling line 502 in the pair have the substantially same width. Consequently, it is possible that an amount of the electric charges generated at the connecting line 501 is substantially equal to an amount of the electric charges generated at the canceling line 502. Therefore, the electric charges resulting from a change in the temperature of the surrounding environment can be more suppressed from being outputted via each output terminal 400.

Further, as mentioned in the above, in the pyroelectric infrared detection element 101 of the present embodiment, with respect to each of the opposite surfaces of the pyroelectric substrate 10 in the thickness direction, the electrodes 30, the connecting lines 501, the conductor pattern parts 430, and the canceling lines 502 are arranged with twofold rotational symmetry with regard to a symmetrical axis passing through the center of the pyroelectric substrate 10. Consequently, the performance is not changed even when the direction (the right-left direction in FIG. 1) of the pyroelectric infrared detection element 101 is changed. For example, the pyroelectric infrared detection element 101 can be mounted on a package, a mounting substrate, and a circuit board without concern for the polarity of the paired output terminals 410 and 420.

(Second Embodiment)

Figure 14:
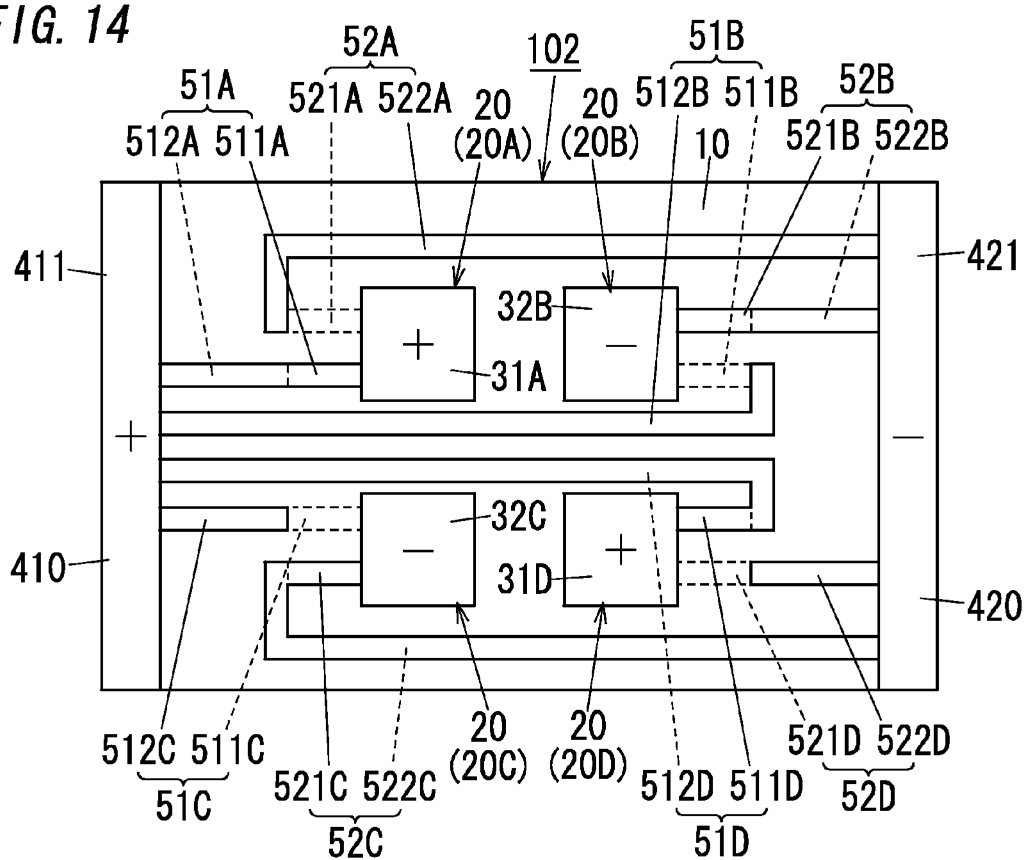
FIG. 14 is a plane view illustrating the upper surface of the pyroelectric infrared detection element of the second embodiment.
Figure 15:
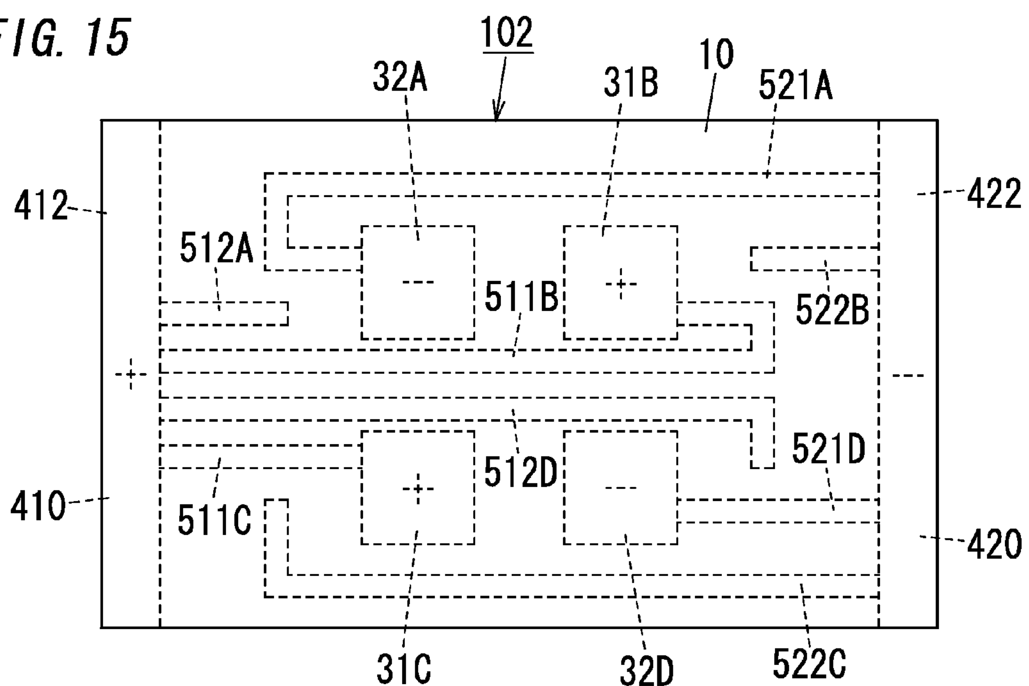
FIG. 15 is a plane view illustrating the lower surface of the pyroelectric infrared detection element of the second embodiment as seen from the above.

FIG. 14 and FIG. 15 show the pyroelectric infrared detection element 102 of the present embodiment which has the same basic configuration as the first embodiment, but is different from the first embodiment in that the pyroelectric infrared detection element 102 of the present embodiment is a quad-type element in which the four light receiving parts 20 are provided to the single pyroelectric substrate 10. Besides, components common to the present embodiment and the first embodiment are designated by the same reference numerals and explanations thereof are deemed unnecessary.

The pyroelectric infrared detection element 102 of the present embodiment includes four pyroelectric elements 20 (20A, 20B, 20C, and 20D). The four pyroelectric elements 20A, 20B, 20C, and 20D are arranged in a 2 by 2 matrix manner. Besides, in order to distinguish the four pyroelectric elements 20 from each other, if necessary, the suffix "A" is attached to the reference numerals of the components belonging to the pyroelectric elements 20A, and the suffix "B" is attached to the reference numerals of the components belonging to the pyroelectric elements 20B, and the suffix "C" is attached to the reference numerals of the components belonging to the pyroelectric elements 20C, and the suffix "D" is attached to the reference numerals of the components belonging to the pyroelectric elements 20D.

First, the pyroelectric elements 20A and 20D are explained below. As shown in FIG. 14, each of the first electrodes 31A and 31D is formed on the upper surface of the pyroelectric substrate 10. Each of the second electrodes 32A and 32D is formed on the lower surface of the pyroelectric substrate 10. With regard to the pyroelectric elements 20A and 20D, the upper surface of the pyroelectric substrate 10 defines the first surface, and the lower surface of the pyroelectric substrate 10 defines the second surface.

As shown in FIG. 14, the first connecting lines 511A and 511D are formed on the upper surface of the pyroelectric substrate 10. The first connecting lines 511A and 511D connect the first electrodes 31A and 31D to the conductor pattern part 411 of the first output terminal 410, respectively. The first canceling lines 512A and 512D are formed on the lower surface of the pyroelectric substrate 10 so as to be opposite to the first connecting lines 511A and 511D, respectively. Further, each of the first canceling lines 512A and 512D is electrically connected to the conductor pattern part 412 of the first output terminal 410.

As shown in FIG. 15, the second connecting lines 521A and 521D are formed on the lower surface of the pyroelectric substrate 10. The second connecting lines 521A and 521D connect the second electrodes 32A and 32D to the conductor pattern part 422 of the second output terminal 420, respectively. As shown in FIG. 14, the second canceling lines 522A and 522D are formed on the upper surface of the pyroelectric substrate 10 so as to be opposite to the second connecting lines 521A and 521D, respectively. Further, each of the second canceling lines 522A and 522D is electrically connected to the conductor pattern part 421 of the second output terminal 420.

Next, the pyroelectric elements 20B and 20C are explained below. As shown in FIG. 14, each of the first electrodes 31B and 31C is formed on the lower surface of the pyroelectric substrate 10. Each of the second electrodes 32B and 32C is formed on the upper surface of the pyroelectric substrate 10. With regard to the pyroelectric elements 20B and 20C, the upper surface of the pyroelectric substrate 10 defines the second surface, and the lower surface of the pyroelectric substrate 10 defines the first surface.

As shown in FIG. 15, the first connecting lines 511B and 511C are formed on the lower surface of the pyroelectric substrate 10. The first connecting lines 511B and 511C connect the first electrodes 31B and 31C to the conductor pattern part 412 of the first output terminal 410, respectively. As shown in FIG. 14, the first canceling lines 512B and 512C are formed on the upper surface of the pyroelectric substrate 10 so as to be opposite to the first connecting lines 511B and 511C, respectively. Further, each of the first canceling lines 512B and 512C is electrically connected to the conductor pattern part 411 of the first output terminal 410.

As shown in FIG. 14, the second connecting lines 521B and 521C are formed on the upper surface of the pyroelectric substrate 10. The second connecting lines 521B and 521C connect the second electrodes 32B and 32C to the conductor pattern part 421 of the second output terminal 420, respectively. The second canceling lines 522B and 522C are formed on the lower surface of the pyroelectric substrate 10 so as to be opposite to the second connecting lines 521B and 521C, respectively. Further, each of the second canceling lines 522B and 522C is electrically connected to the conductor pattern part 422 of the second output terminal 420.

As described in the above, in the pyroelectric infrared detection element 102 of the present embodiment, the light receiving parts 20 are arranged in an even number by even number matrix manner in the pyroelectric substrate 10. More specifically, the four light receiving parts 30 is arranged in a 2 by 2 matrix manner in the single pyroelectric substrate 10. In this arrangement, the electrode 30 of each light receiving part 20 is formed into a square shape. The electrodes 30 of the respective light receiving parts 20 are arranged such that the centers of the respective light receiving parts 20 are located on the respective corners of an imaginary square inside the outline of the pyroelectric substrate 10.

Further, in the pyroelectric infrared detection element 102, the two light receiving parts 20 on the same diagonal line of the four light receiving parts 20 are connected in parallel with each other, and the two light receiving parts 20 on different diagonal lines are connected in anti-parallel with each other. More specifically, the light receiving parts 20A and 20D are connected in parallel with each other, and the light receiving parts 20B and 20C are connected in parallel with each other. In brief, with regard to the pyroelectric infrared detection element 102, it is assumed that a direction in which the paired output terminals 410 and 420 are arranged in line is defined as an X direction (horizontal direction) within a plane parallel to the opposite surfaces of the pyroelectric substrate 10. It is assumed that a direction perpendicular to the direction in which the paired output terminals 410 and 420 are arranged in line is defined as a Y direction (vertical direction) within the plane. In this assumption, the two light receiving parts 20 formed in line in the X direction are connected in anti-parallel with each other, and the two light receiving parts 20 formed in line in the Y direction are connected in anti-parallel with each other.

Consequently, according to the pyroelectric infrared detection element 102 of the present embodiment, with connecting the light receiving parts 20 and 20 in anti-parallel with each other, the electric charges generated at the two light receiving parts 20 resulting from a change in the temperature of the surrounding environment cancel each other out. Moreover, the pyroelectric infrared detection element 102 of the present embodiment is a quad-type pyroelectric infrared detection element. Hence, when a temperature change occurs in the entire pyroelectric infrared detection element 102, the electric charges generated at each light receiving part 20 are not outputted as a signal.

Hence, in the pyroelectric infrared detection element 102 of the present embodiment, with regard to the light receiving parts 20 and 20 in anti-parallel with each other, the electric charges generated at the two light receiving parts 20 resulting from a change in the temperature of the surrounding environment or the like cancel each other out. It is possible to prevent outputting the output current caused by a temperature change in the X direction and/or the Y direction.

Figure 16:
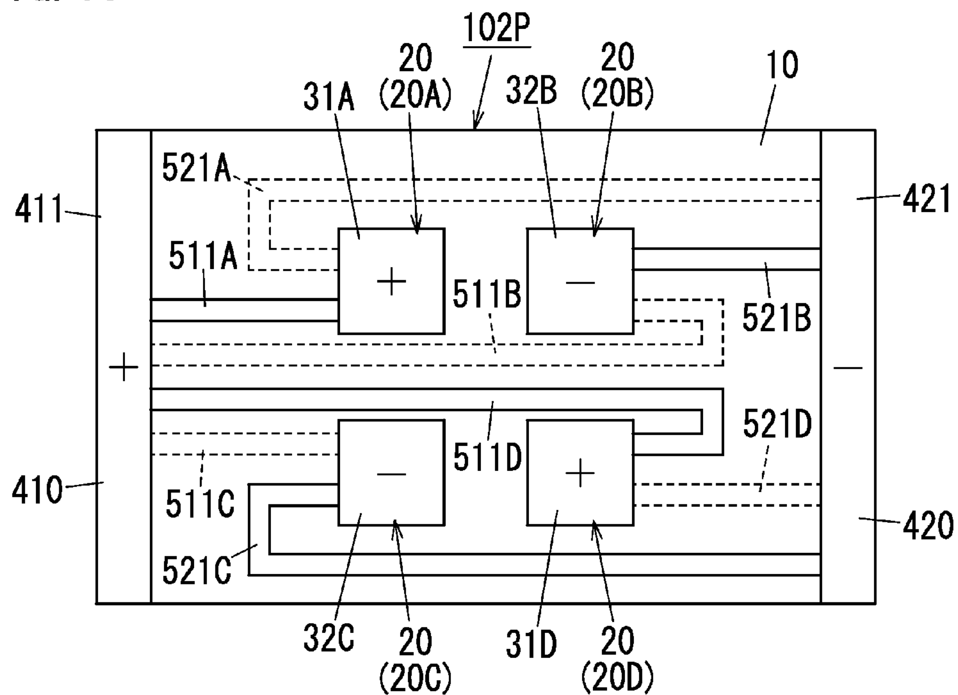
FIG. 16 is a plane view illustrating the upper surface of the pyroelectric infrared detection element of the second comparative example.
Figure 17:
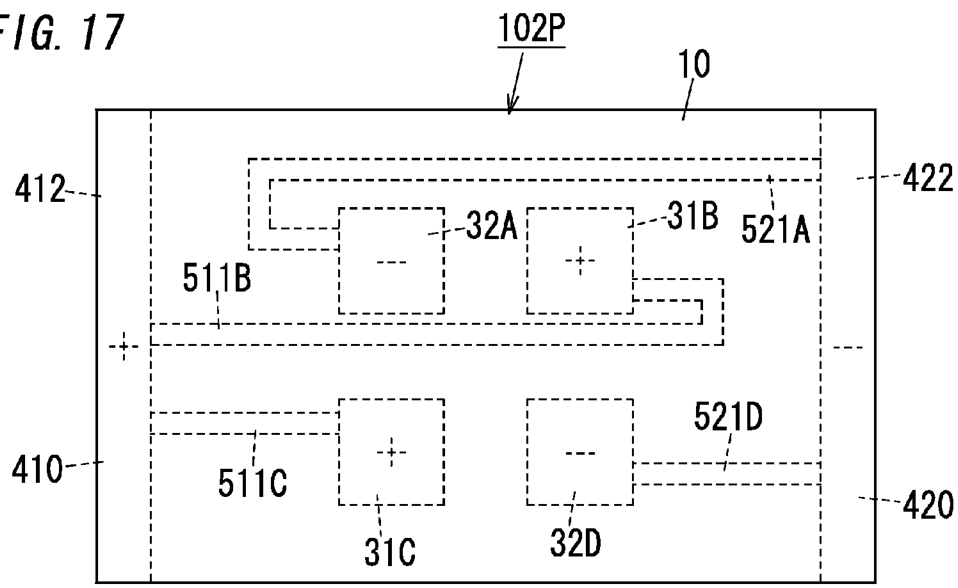
FIG. 17 is a plane view illustrating the lower surface of the pyroelectric infrared detection element of the second comparative example as seen from the above.

Further, the pyroelectric infrared detection element 102 of the present embodiment is provided with the dummy line (canceling line) 502 designed similar to that of the first embodiment. Therefore, the pyroelectric infrared detection element 102 of the present embodiment can more suppress outputting the electric current caused by a temperature change in the X direction and/or the Y direction, without changing the pyroelectric performance of the pyroelectric substrate 10. It has been confirmed that the example of the pyroelectric infrared detection element 102 of the present embodiment can suppress the output current resulting from a change in the temperature relative to the pyroelectric infrared detection element 102P of the second comparative example devoid of the canceling line 502 as shown in FIG. 16 and FIG. 17.

(Third Embodiment)

Figure 18:
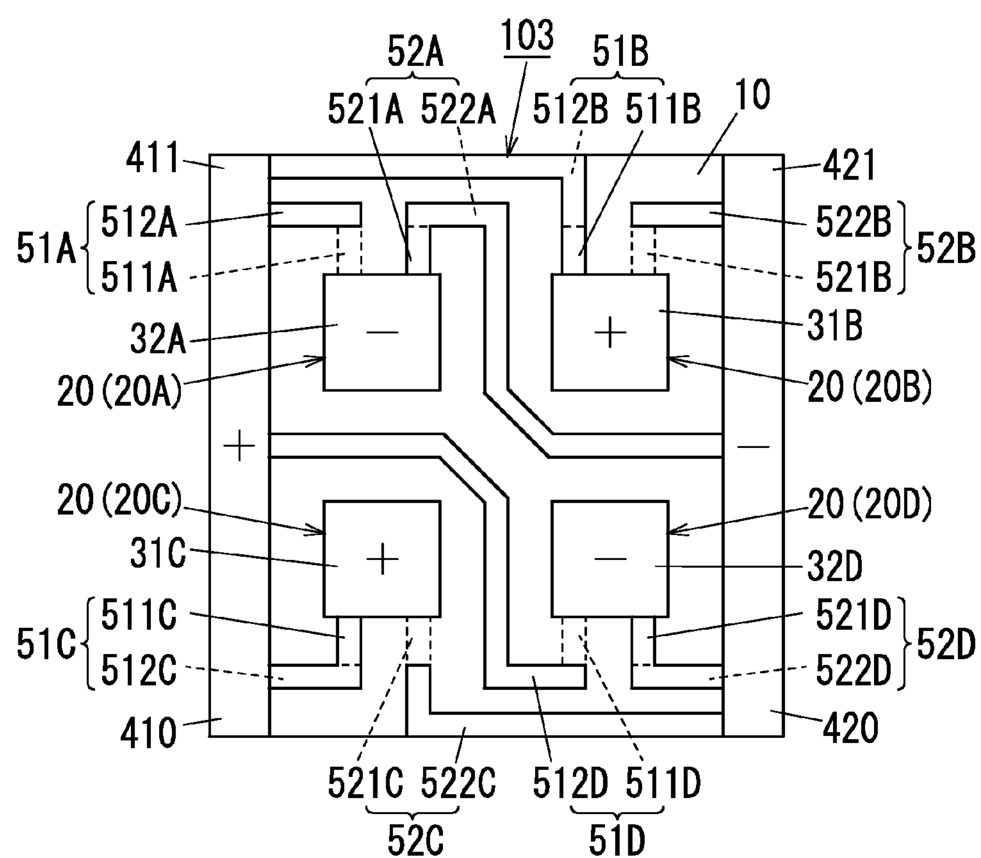
FIG. 18 is a plane view illustrating the upper surface of the pyroelectric infrared detection element of the third embodiment.
Figure 19:
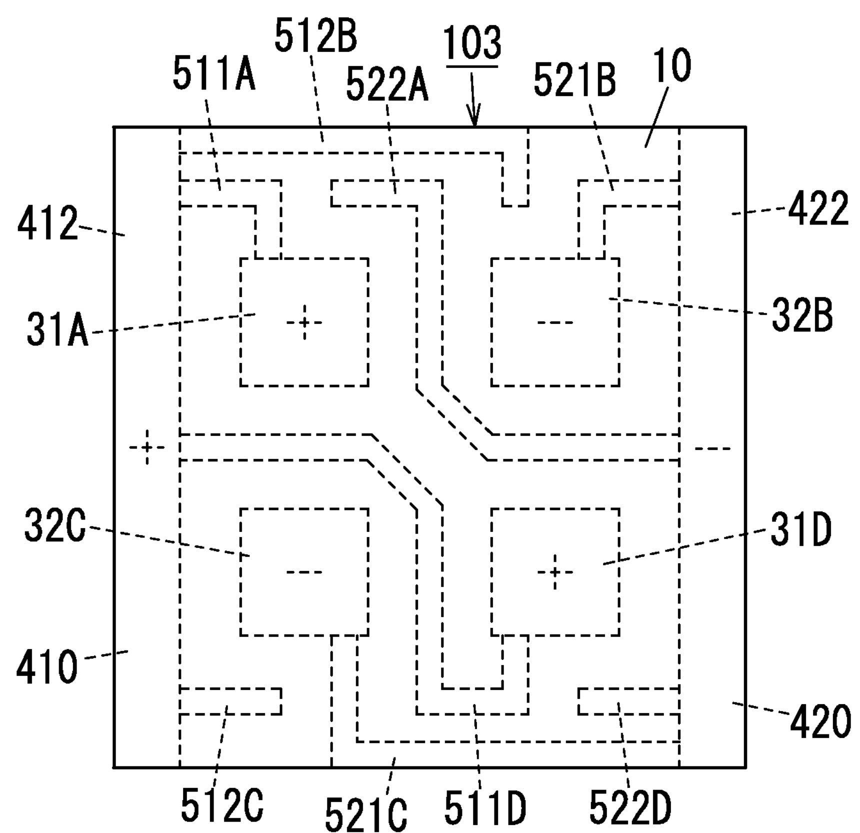
FIG. 19 is a plane view illustrating the lower surface of the pyroelectric infrared detection element of the third embodiment as seen from the above.

FIG. 18 and FIG. 19 show the pyroelectric infrared detection element 103 of the present embodiment which has the same basic configuration as the second embodiment, but is different from the second embodiment in that the pyroelectric infrared detection element 103 has the pyroelectric substrate 10 in the form of a square shape and a different layout from the second embodiment. Besides, components common to the present embodiment and the first embodiment are designated by the same reference numerals and explanations thereof are deemed unnecessary.

Similar to the second embodiment, the pyroelectric infrared detection element 103 of the present embodiment includes the four pyroelectric elements (20A, 20B, 20C, and 20D). The four pyroelectric elements 20A, 20B, 20C, and 20D are arranged in a 2 by 2 matrix manner.

First, the pyroelectric elements 20A and 20D are explained below. As shown in FIG. 19, each of the first electrodes 31A and 31D is formed on the lower surface of the pyroelectric substrate 10. As shown in FIG. 18, each of the second electrodes 32A and 32D is formed on the upper surface of the pyroelectric substrate 10. With regard to the pyroelectric elements 20A and 20D, the upper surface of the pyroelectric substrate 10 defines the second surface, and the lower surface of the pyroelectric substrate 10 defines the first surface.

As shown in FIG. 19, the first connecting lines 511A and 511D are formed on the lower surface of the pyroelectric substrate 10. The first connecting lines 511A and 511D connect the first electrodes 31A and 31D to the conductor pattern part 412 of the first output terminal 410, respectively. As shown in FIG. 18, the first canceling lines 512A and 512D are formed on the upper surface of the pyroelectric substrate 10 so as to be opposite to the first connecting lines 511A and 511D, respectively. Further, each of the first canceling lines 512A and 512D is electrically connected to the conductor pattern part 411 of the first output terminal 410.

As shown in FIG. 18, the second connecting lines 521A and 521D are formed on the upper surface of the pyroelectric substrate 10. The second connecting lines 521A and 521D connect the second electrodes 32A and 32D to the conductor pattern part 421 of the second output terminal 420, respectively. The second canceling lines 522A and 522D are formed on the lower surface of the pyroelectric substrate 10 so as to be opposite to the second connecting lines 521A and 521D, respectively. Further, each of the second canceling lines 522A and 522D is electrically connected to the conductor pattern part 422 of the second output terminal 420.

Next, the pyroelectric elements 20B and 20C are explained below. As shown in FIG. 18, each of the first electrodes 31B and 31C is formed on the upper surface of the pyroelectric substrate 10. Each of the second electrodes 32B and 32C is formed on the lower surface of the pyroelectric substrate 10. With regard to the pyroelectric elements 20B and 20C, the upper surface of the pyroelectric substrate 10 defines the first surface, and the lower surface of the pyroelectric substrate 10 defines the second surface.

As shown in FIG. 18, the first connecting lines 511B and 511C are formed on the upper surface of the pyroelectric substrate 10. The first connecting lines 511B and 511C connect the first electrodes 31B and 31C to the conductor pattern part 411 of the first output terminal 410, respectively. The first canceling lines 512B and 512C are formed on the lower surface of the pyroelectric substrate 10 so as to be opposite to the first connecting lines 511B and 511C, respectively. Further, each of the first canceling lines 512B and 512C is electrically connected to the conductor pattern part 412 of the first output terminal 410.

As shown in FIG. 19, the second connecting lines 521B and 521C are formed on the lower surface of the pyroelectric substrate 10. The second connecting lines 521B and 521C connect the second electrodes 32B and 32C to the conductor pattern part 422 of the second output terminal 420, respectively. As shown in FIG. 18, the second canceling lines 522B and 522C are formed on the upper surface of the pyroelectric substrate 10 so as to be opposite to the second connecting lines 521B and 521C, respectively. Further, each of the second canceling lines 522B and 522C is electrically connected to the conductor pattern part 421 of the second output terminal 420.

Figure 20:
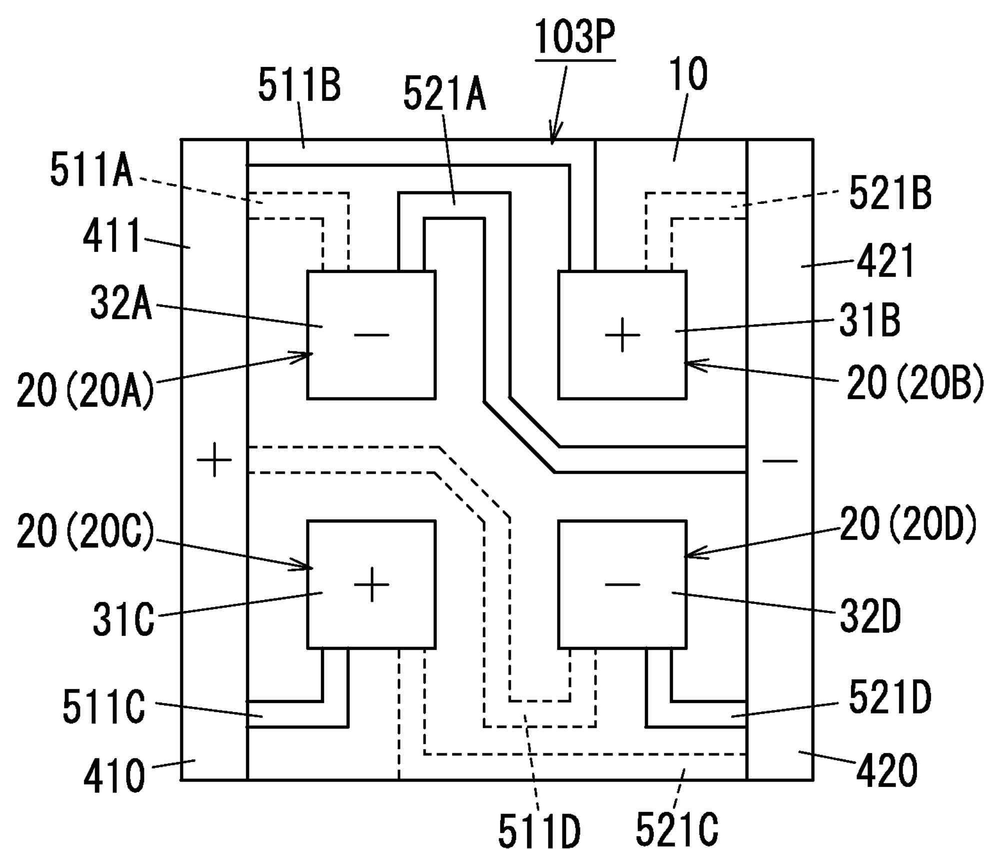
FIG. 20 is a plane view illustrating the upper surface of the pyroelectric infrared detection element of the third comparative example.
Figure 21:
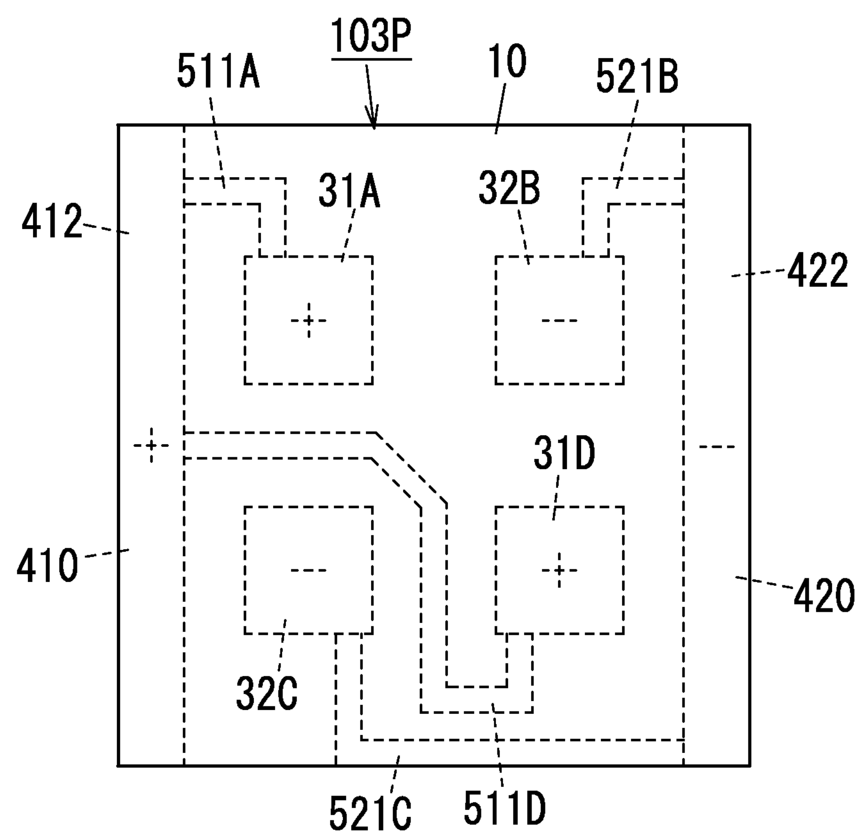
FIG. 21 is a plane view illustrating the lower surface of the pyroelectric infrared detection element of the third comparative example as seen from the above.

Accordingly, relative to the pyroelectric infrared detection element 103P of the third comparative example illustrated in FIG. 20 and FIG. 21, the pyroelectric infrared detection element 103 of the present embodiment can prevent the electric charges caused by a temperature variation of the surrounding environment from being outputted via the respective output terminals 400, without deteriorating the pyroelectric performance of the pyroelectric substrate 10.

(Fourth Embodiment)

Figure 22:
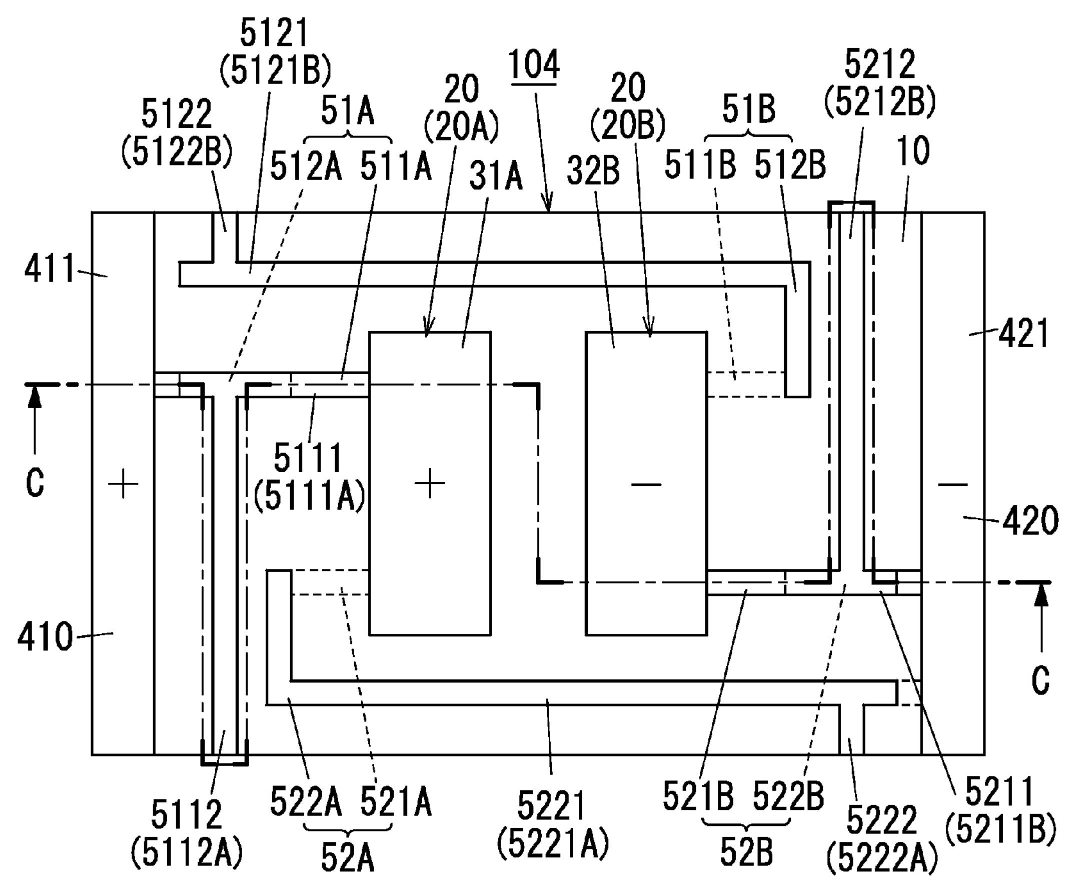
FIG. 22 is a plane view illustrating the upper surface of the pyroelectric infrared detection element of the fourth embodiment.
Figure 23:
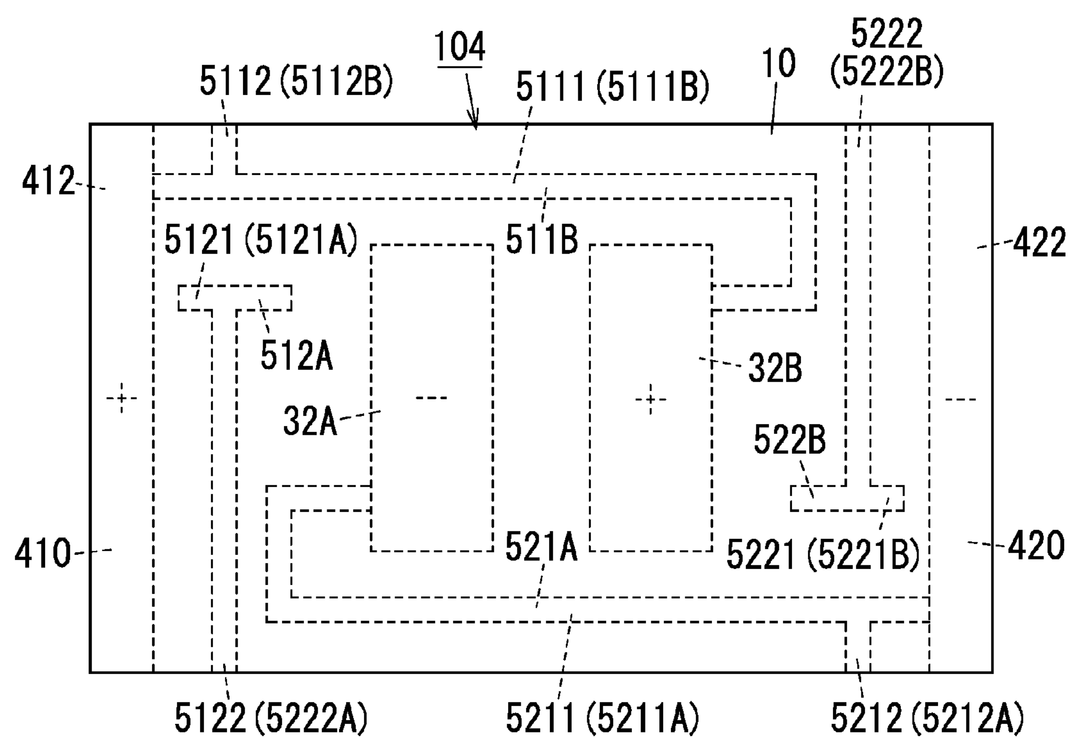
FIG. 23 is a plane view illustrating the lower surface of the pyroelectric infrared detection element of the fourth embodiment as seen from the above.
Figure 24:
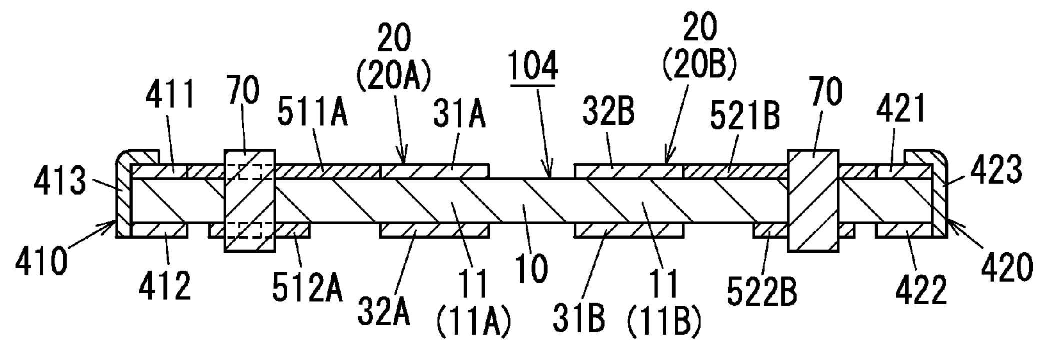
FIG. 24 is a cross sectional view taken along the line C-C of FIG. 22.

FIG. 22 to FIG. 24 show the pyroelectric infrared detection element 104 of the present embodiment which has the same basic configuration as the first embodiment, but is different from the first embodiment in that the connecting line 501 and the dummy line (canceling line) 502 in the pair are connected to a site other than the output terminal 400 by use of a connection part 70 made of electrically conductive adhesive so as to have the same electric potential.

In the pyroelectric infrared detection element 104 of the present embodiment, the first connecting line 511 includes an electrode connection part (first electrode connection part) 5111 designed to connect the first electrode 31 to the first output terminal 410, and a line connection part (first line connection part) 5112 designed to be connected to the first canceling line 512. As shown in FIG. 22, the first line connection part 5112A extends from the first electrode connection part 5111A to a first end (the lower end in FIG. 22) of the pyroelectric substrate 10 in a second direction (a direction respectively perpendicular to the thickness direction and the first direction of the pyroelectric substrate 10). The first line connection part 5112B extends from the first electrode connection part 5111B to a second end (the upper end in FIG. 23) of the pyroelectric substrate 10 in the second direction.

The first canceling line 512 includes an opposite part (first opposite part) 5121 opposite to the first electrode connection part 5111 of the first connecting line 511, and an extension part (first extension part) 5122 designed to be connected to the first connecting line 511. The first extension part 5122A extends from the first opposite part 5121A to the first end (the lower end in FIG. 23) of the pyroelectric substrate 10 in the second direction so as to be opposite to the first line connection part 5112A. The first extension part 5122B extends from the first opposite part 5121B to the second end (the upper end in FIG. 22) of the pyroelectric substrate 10 in the second direction so as to be opposite to the first line connection part 5112B.

The second connecting line 521 includes an electrode connection part (second electrode connection part) 5211 designed to connect the second electrode 32 to the second output terminal 420, and a line connection part (second line connection part) 5212 designed to be connected to the second canceling line 522. As shown in FIG. 23, the second line connection part 5212A extends from the second electrode connection part 5211A to the first end (the lower end in FIG. 23) of the pyroelectric substrate 10 in the second direction. The second line connection part 5212B extends from the second electrode connection part 5211B to the second end (the upper end in FIG. 22) of the pyroelectric substrate 10 in the second direction.

The second canceling line 522 includes an opposite part (second opposite part) 5221 opposite to the second electrode connection part 5211 of the second connecting line 521, and an extension part (second extension part) 5222 designed to be connected to the second connecting line 521. The second extension part 5222A extends from the second opposite part 5221A to the first end (the lower end in FIG. 22) of the pyroelectric substrate 10 in the second direction so as to be opposite to the second line connection part 5212A. The second extension part 5222B extends from the second opposite part 5221B to the second end (the upper end in FIG. 23) of the pyroelectric substrate 10 in the second direction so as to be opposite to the second line connection part 5212B.

The first line connection part 5112A of the first connecting line 511A is electrically connected to the first extension part 5122A of the first canceling line 512A via the connection part 70 formed at the first end (the lower end in FIG. 22 and FIG. 23) of the pyroelectric substrate 10 in the second direction (see FIG. 24). Similarly, the first line connection part 5112B of the first connecting line 511B is electrically connected to the first extension part 5122B of the first canceling line 512B via the connection part 70 formed at the second end (the upper end in FIG. 22 and FIG. 23) of the pyroelectric substrate 10 in the second direction.

The second line connection part 5212A of the second connecting line 521A is electrically connected to the second extension part 5222A of the second canceling line 522A via the connection part 70 formed at the first end (the lower end in FIG. 22 and FIG. 23) of the pyroelectric substrate 10 in the second direction. Similarly, the second line connection part 5212B of the second connecting line 521B is electrically connected to the second extension part 5222B of the second canceling line 522B via the connection part 70 formed at the second end (the upper end in FIG. 22 and FIG. 23) of the pyroelectric substrate 10 in the second direction (see FIG. 24).

Besides, the quad-type pyroelectric infrared detection elements 102 and 103 respectively explained in the second and third embodiments have the connecting lines 501 more than the dual-type pyroelectric infrared detection element 1, and then shows a complex layout of the connecting lines 501. Therefore, with regard to the quad-type pyroelectric infrared detection elements 102 and 103, it is preferable that the connecting line 501 and the canceling line 502 in the pair are connected to the output terminal 400 to have the same electric potential. Consequently, flexibility of layout design of the canceling lines 502 can be improved. Therefore, it is possible to facilitate designing a layout in which the connecting line 501 and the canceling line 502 in the pair are arranged opposite to each other.

(Fifth Embodiment)

Figure 25:
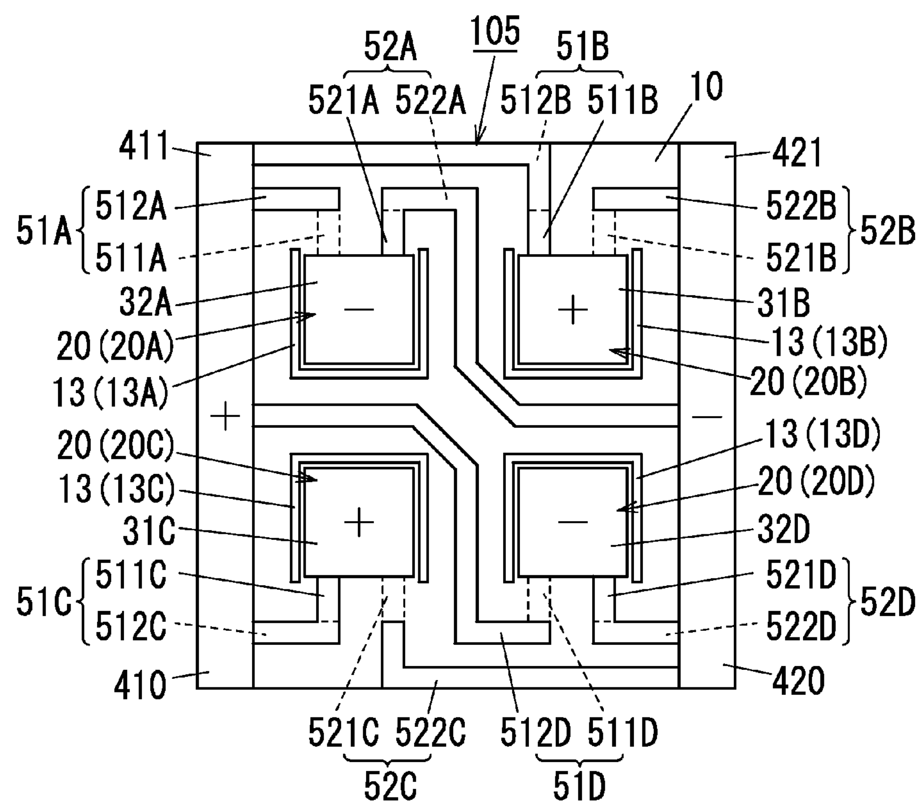
FIG. 25 is a plane view illustrating the upper surface of the pyroelectric infrared detection element of the fifth embodiment.
Figure 26:
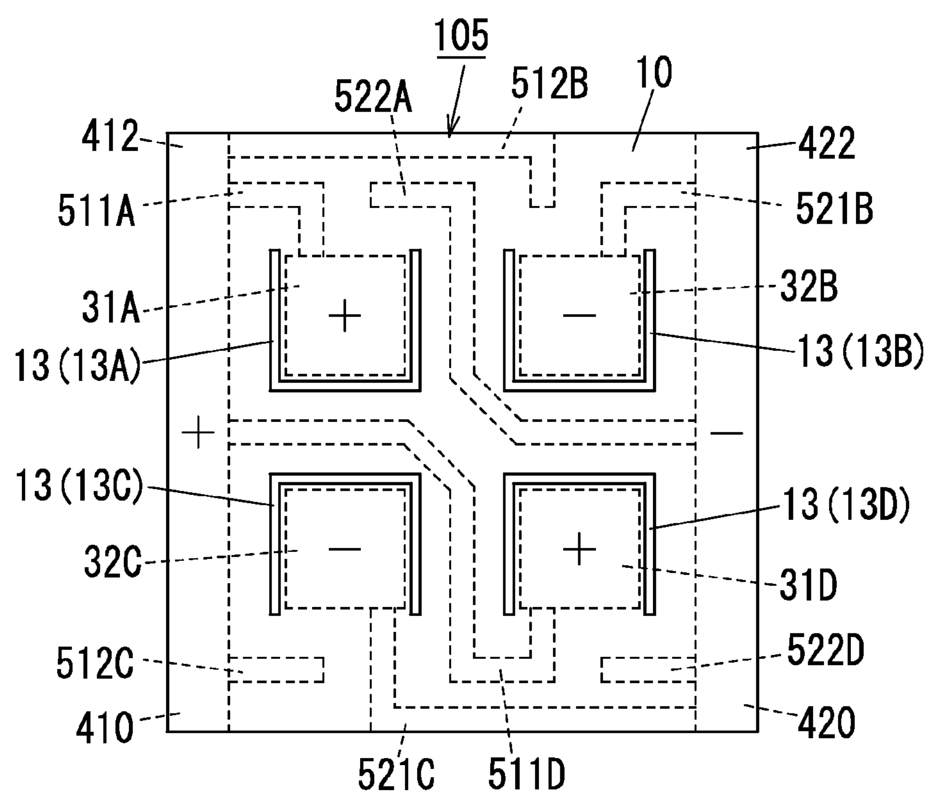
FIG. 26 is a plane view illustrating the lower surface of the pyroelectric infrared detection element of the fifth embodiment as seen from the above.

FIG. 25 and FIG. 26 show the pyroelectric infrared detection element 105 of the present embodiment which has the same basic configuration as the third embodiment, but is different from the third embodiment in that the pyroelectric substrate 10 of the present embodiment is provided with slits 13 for thermally insulating the respective light receiving parts 20 from the other part of the pyroelectric substrate 10. Besides, components common to the present embodiment and the third embodiment are designated by the same reference numerals and explanations thereof are deemed unnecessary.

The pyroelectric infrared detection element 105 of the present embodiment includes the four slits 13 (13A to 13D) designed to penetrate through the pyroelectric substrate 10 in the thickness direction. The slits 13A, 13B, 13C, and 13D are formed to surround the infrared absorption parts 11A, 11B, 11C, and 11D of the pyroelectric elements 20A, 20B, 20C, and 20D, respectively.

As mentioned in the above, in the pyroelectric infrared detection element 105, the pyroelectric substrate 10 is provided with the slit 13 which penetrates through the pyroelectric substrate 10 in the thickness direction so as to surround the light receiving part 20 with respect to a plane view.

The above slit 13 is formed in the pyroelectric substrate 10 for each light receiving part 20, and surrounds three of four sides of the corresponding light receiving part 20 with respect to a plane view. Hence, the pyroelectric infrared detection element 1 has a cantilever structure in which each light receiving part 20 is supported at its only one side by the pyroelectric substrate 10. Consequently, directions in which heat is transferred from the pyroelectric substrate 10 to the pyroelectric element 20 are limited to a single direction. It is possible to prevent thermal connection between each light receiving part 20 and the connecting line 501 as well as the canceling line 502. According to the pyroelectric infrared detection element 105, with forming the slits 13, it is possible to prevent the respective light receiving parts 20 from having different time constants of discharge of the electric charges caused by a temperature change of the surrounding environment. Therefore, it is possible to more suppress the electric charges caused by a temperature change of the surrounding environment from being outputted via the respective output terminals 400.

Besides, the pyroelectric infrared detection elements 101 to 104 of the other first to fourth embodiments may have the pyroelectric substrate 10 provided with one or more slits 13. Further, the similar slits 13 may be applied to a single-type pyroelectric infrared detection element as well as the dual-type pyroelectric infrared detection element and the quad-type pyroelectric infrared detection element.

(Sixth Embodiment)

Figure 27:
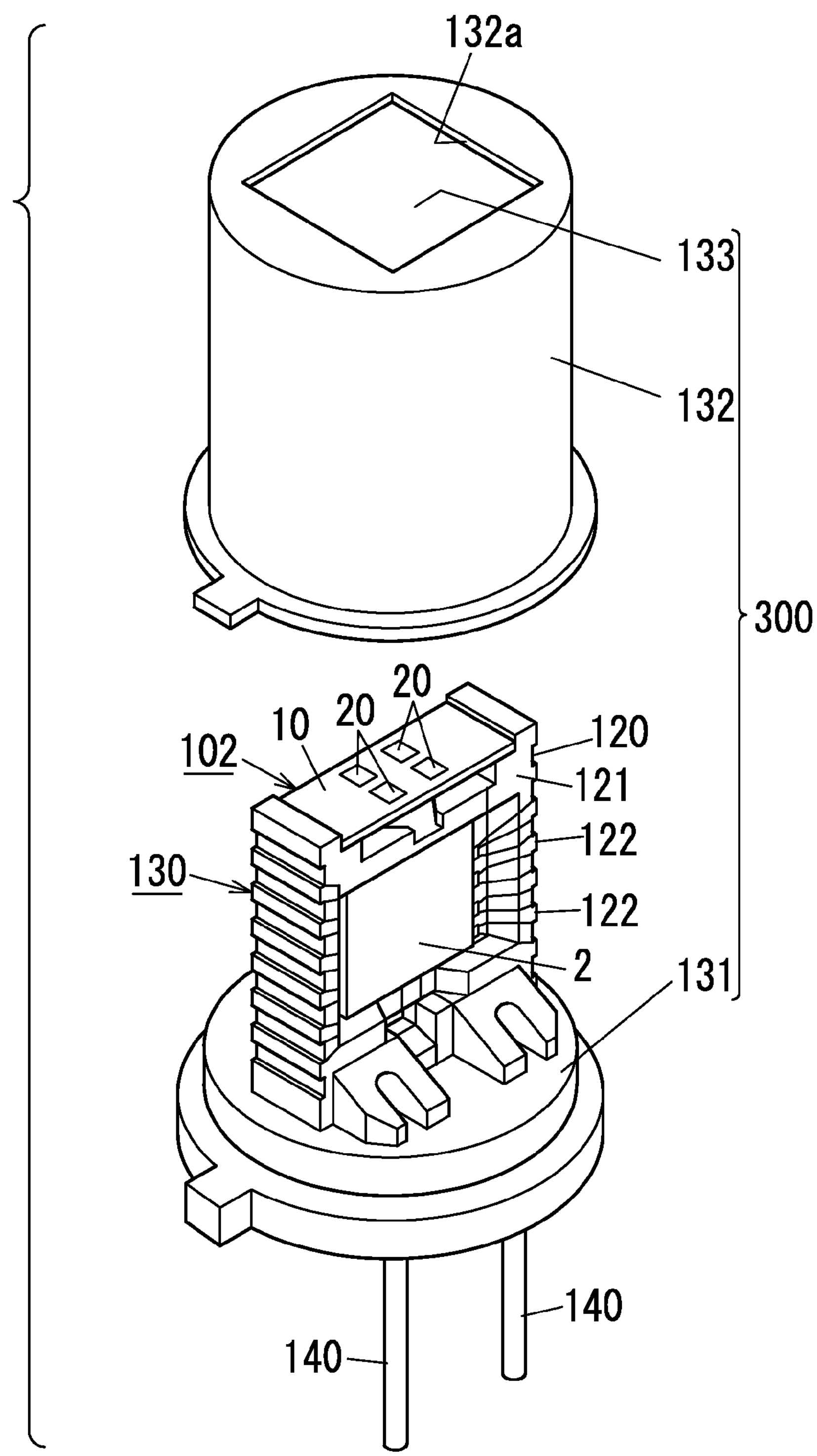
FIG. 27 is a schematic exploded perspective view illustrating the pyroelectric infrared detection element of the sixth embodiment.

As shown in FIG. 27, the infrared sensor of the present embodiment includes a three-dimensional circuit block 130 and a package 300 configured to accommodate the three-dimensional circuit block 130. The three-dimensional circuit block 130 includes the pyroelectric infrared detection element 102, an IC element 200, a capacitor (not shown), an MID (Molded Interconnect Devices) substrate 120. The IC element 200 is provided with a signal processing circuit configured to perform signal processing of the output current of the pyroelectric infrared detection element 102. The capacitor is an external part connected to the IC element 200. The MID substrate 120 is used as a substrate on which the pyroelectric infrared detection element 102, the IC element 200, and the capacitor are mounted. The MID substrate 120 includes a plastic molded part 121 provided at its surface with a circuit pattern part 122. Besides, in the present embodiment, the IC element 200 and the capacitor constitute a signal processing unit configured to perform signal processing of the output current of the pyroelectric infrared detection element 102. Further, the signal processing unit may have a circuit configuration selected from well-known circuit configurations as disclosed in the above patent document 1.

The package 300 of the present embodiment is a can package. The package 300 includes a stem 131, a cap 132, and a window part (infrared transmitting member) 133. The stem 131 is shaped into a circular disk. The cap 132 is shaped into a circular hollow cylinder with a bottom. The cap 132 is fixed to the stem 131. The window part 133 is arranged so as to cover an opening part 132*a* formed in the bottom of the cap 132. The window part 133 has a function of transmitting infrared. The stem 132 and the cap 132 are made of metal. For example, the infrared transmitting member 133 is a flat-plate optical filter, and this optical filter includes a silicon substrate and a filter part which is constituted by an optical multilayer film and is formed on at least one of opposite surfaces of the silicon substrate. However, the infrared transmitting member 133 is not limited to the optical filter but may be a semiconductor lens formed by use of a process of fabricating a semiconductor lens derived from an anodic oxidation technique (see JP 3897055 B1, and JP 3897056 B1). The stem 131 supports three lead pins 140 (FIG. 27 shows only two of the three lead pins 140) electrically connected to the above signal processing unit. Each lead pin 140 is coupled to the MID substrate 120 and is electrically connected to the above signal processing unit. Besides, one of the three lead pins 140 is used for power supply to the IC element 200, another is used for signal output, and the other is used for grounding.

As mentioned in the above, the infrared sensor includes the signal processing unit configured to perform signal processing of the output current of the pyroelectric infrared detection element 102 and the package 300 in which the pyroelectric infrared detection element 102 and the signal processing unit are housed. The package 300 has a part constituted by an infrared transmitting member 133 configured to transmit infrared which is selected as a detection object of the pyroelectric infrared detection element 102.

In other words, the infrared sensor of the present embodiment includes the pyroelectric infrared detection element 102, the signal processing circuit (signal processing unit), and the package 300. The signal processing circuit is configured to generate a signal indicative of predetermined information (e.g., presence or absence of a human body) based on a current flowing between the first output terminal 410 and the second output terminal 420. The package 300 is configured to accommodate the pyroelectric infrared detection element 102 and the signal processing unit. The package 300 is provided with the window part 133 designed to allow the pyroelectric element (light receiving part) 20 of the pyroelectric infrared detection element 102 to receive infrared of a predetermined frequency. The window part 133 is made of material which transmits infrared of the predetermined frequency.

The infrared sensor of the present embodiment is a human detection sensor, and employs the pyroelectric infrared detection element 102 explained in the second embodiment, as a pyroelectric infrared detection element. In addition, the pyroelectric infrared detection element 103 explained in the third embodiment and the pyroelectric infrared detection element 105 explained in the fifth embodiment may be used as the pyroelectric infrared detection element of the infrared sensor of the present embodiment.

As mentioned in the above, since the infrared sensor of the present embodiment employs the pyroelectric infrared detection element 102 explained in the second embodiment, the infrared sensor of the present embodiment is insusceptible to a change in the temperature of the surrounding environment. Consequently, it is possible to suppress the undesired effect caused by a change in the temperature of the surrounding environment (in this embodiment, it is possible to suppress occurrence of false detection of a human body).

Further, the infrared sensor of the present embodiment may employ the pyroelectric infrared detection element provided with the slits 13 surrounding the respective light receiving parts 20, which is similar to the pyroelectric infrared detection element 105 explained in the fifth embodiment. With this arrangement, each light receiving part is formed into a square shape in a plane view, and each slit 13 surrounds three of four sides of a corresponding light receiving part 20 with respect to a plane view. Consequently, it is possible to successfully detect a movement of a human body along the X direction and the Y direction explained in the second embodiment.

(Seventh Embodiment)

Figure 28:
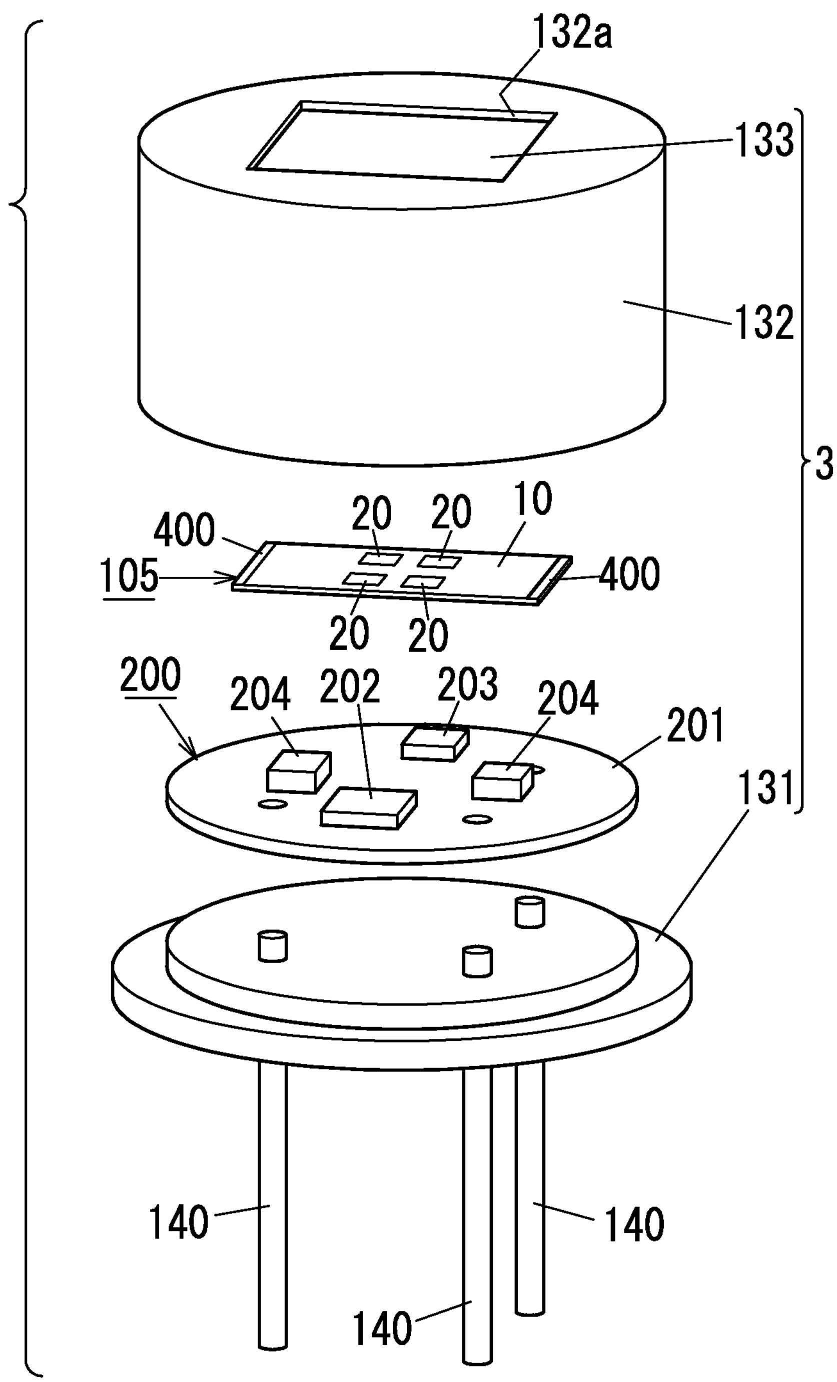
FIG. 28 is a schematic exploded perspective view illustrating the pyroelectric infrared detection element of the seventh embodiment.
Figure 29:
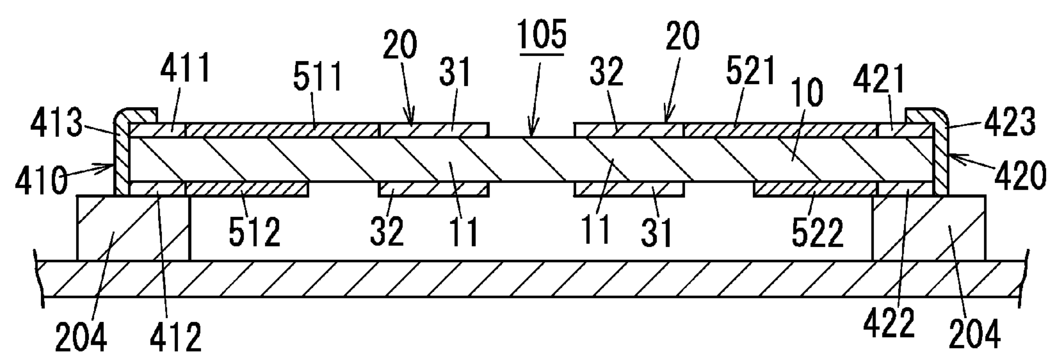
FIG. 29 is a schematic cross sectional view illustrating a primary part of the pyroelectric infrared detection element of the seventh embodiment.

As shown in FIG. 28 and FIG. 29, the infrared sensor of the present embodiment includes the pyroelectric infrared detection element 105, a signal processor 200, and a package 3. The signal processor 200 is configured to perform signal processing of the output current of the pyroelectric infrared detection element 105. The package 3 is designed to accommodate the pyroelectric infrared detection element 105 and the signal processor 200.

The signal processing unit 200 in the present embodiment is a current voltage conversion circuit using an electric field effect transistor 202 for impedance conversion having its gate connected to the pyroelectric infrared detection element 105, and a resistor 203 used for determining a gate voltage of the electric field effect transistor 202. In brief, the signal processing unit 200 is constituted by the pyroelectric infrared detection element 105, the electric field effect transistor 202, the resistor 203, and a circuit board 201. The circuit board is a printed wiring board on which these circuit components are mounted. The circuit board 201 is shaped into a circular disk.

The infrared sensor of the present embodiment is a human detection sensor, and employs the pyroelectric infrared detection element 105 explained in the fifth embodiment, as a pyroelectric infrared detection element. In addition, the pyroelectric infrared detection element 102 explained in the second embodiment and the pyroelectric infrared detection element 103 explained in the third embodiment may be used as the pyroelectric infrared detection element of the infrared sensor of the present embodiment. The pyroelectric infrared detection element 105 is supported by two supporting rests 204 and 204 arranged on a surface of the circuit board 201.

The package 3 has the same configuration as that of the sixth embodiment. In brief, the package 3 is constituted by the stem 131 made of metal, the cap 132 made of metal, and the infrared transmitting member 133. Besides, the stem 131 supports the three lead pins 140 for extracting out the output of the signal processing unit 200. Each lead pin 140 is coupled to the circuit board 201 and is electrically connected to the signal processing unit 200.

As mentioned in the above, since the infrared sensor of the present embodiment employs the pyroelectric infrared detection element 105 explained in the fifth embodiment, the infrared sensor of the present embodiment is insusceptible to a change in the temperature of the surrounding environment. Consequently, it is possible to suppress the undesired effect caused by a change in the temperature of the surrounding environment (in this embodiment, it is possible to suppress occurrence of false detection of a human body).

With regard to the pyroelectric infrared detection elements 102, 103, and 105 of the respective second, third, and fifth embodiments, the light receiving parts 20 are arranged in a 2 by 2 matrix manner. Alternatively, the light receiving parts 20 may be arranged in an even number by even number matrix pattern. For example, the light receiving parts 20 may be arranged in a 4 by 4 matrix pattern, and the light receiving parts 20 may be arranged in a 6 by 6 matrix manner. In brief, each pyroelectric infrared detection element 102, 103, and 105 may include "N" ("N" is even number and is equal to or more than 4) of the pyroelectric elements 20. The "N" of the pyroelectric elements 20 are arranged in an "m" by "n" matrix manner (each of "m" and "n" is even number, and "m"*"n"=16). In this arrangement, preferably, "m" and "n" are equal.

Further, the sixth and seventh embodiments show human body detection sensors as an applicable example of the infrared sensor. The infrared sensor is not limited to such a human body sensor, but may be a gas sensor and a flame sensor, for example. In consideration of intended use, types of the respective pyroelectric infrared detection elements 101 to 105 may be appropriately selected from, a dual-type, a quad-type, and a single-type, for example.

For example, when the infrared sensor is used as a human body detection sensor, the human body detection sensor can be used together with a controller which is configured to turn on and off a switching element (e.g., a switching device and a relay) interposed between a power source and a lighting load in response to an output of the human body detection sensor. With this arrangement, it is possible to suppress the occurrence of a false operation in which the pyroelectric infrared detection element 101, 102, 103, 104, or 105 activates an alarm in response to a change in the temperature of the surrounding environment thereof even though there is no human body within a detection area. Consequently, energy can be conserved.

Especially, when the infrared sensor is applied to a gas sensor or a flame sensor, it is possible to suppress the occurrence of a false operation in which the pyroelectric infrared detection element 101, 102, 103, 104, or 105 activates an alarm in response to a change in the temperature of the surrounding environment thereof even though there is no detection object (e.g., gas or a flame) within the detection area. Consequently, the reliability can be improved.

The invention claimed is:

1. A pyroelectric infrared detection element comprising:

a pyroelectric element including a first electrode, a second electrode opposite to said first electrode, and an infrared absorption part having pyroelectric properties and interposed between said first electrode and said second electrode;

an output terminal unit including a first output terminal and a second output terminal used for extracting a current generated by said pyroelectric element in response to a change in a temperature;

a first wiring part designed to connect said first output terminal to said first electrode; and a second wiring part designed to connect said second output terminal to said second electrode, wherein said first electrode is formed on a first surface of a pyroelectric substrate made of pyroelectric material in a thickness direction, and said second electrode is formed on a second surface of said pyroelectric substrate in the thickness direction, and said infrared absorption part is defined as a part of said pyroelectric substrate interposed between said first electrode and said second electrode, and said first output terminal and said second output terminal are formed on said pyroelectric substrate, and said first wiring part includes a connecting line constituted by an electrically conductive layer formed on said first surface so as to connect said first output terminal to said first electrode, and a canceling line designed to cancel electric charges generated at said connecting line in response to a change in a temperature of said pyroelectric substrate, and said canceling line is constituted by an electrically conductive layer formed on said second surface so as to be not directly connected to said second electrode but to be electrically connected to said connecting line, and said second wiring part includes a second connecting line constituted by an electrically conductive layer formed on said second surface so as to connect said second output terminal to said second electrode, and a second canceling line designed to cancel electric charges generated at said second connecting line in response to a change in a temperature of said pyroelectric substrate, and said second canceling line is constituted by an electrically conductive layer formed on said first surface so as to be not directly connected to said first electrode but to be electrically connected to said second connecting line.

2. A pyroelectric infrared detection element as set forth in claim 1, wherein said canceling line is electrically connected to said connecting line so as to have the same potential as said connecting line.

3. A pyroelectric infrared detection element as set forth in claim 1, wherein said pyroelectric substrate has a first end and a second end in a first direction perpendicular to said thickness direction, and said pyroelectric element is positioned in a center part of said pyroelectric substrate in the first direction, and said first output terminal is formed at said first end, and said second output terminal is formed at said second end.

4. A pyroelectric infrared detection element as set forth in claim 1, wherein said canceling line is electrically connected to said connecting line via said first output terminal.

5. A pyroelectric infrared detection element as set forth in claim 1, wherein said canceling line is formed opposite to said connecting line.

6. A pyroelectric infrared detection element as set forth in claim 1, wherein said canceling line is designed to have the same width as said connecting line.

7. A pyroelectric infrared detection element as set forth in claim 1, wherein said pyroelectric infrared detection element includes “N” (“N” is even number and is equal to or more than 4) of said pyroelectric elements, and the “N” of said pyroelectric elements are arranged in an “m” by “n” matrix manner (each of “m” and “n” is even number, and “m”*“n”=N.

8. A pyroelectric infrared detection element as set forth in claim 1, wherein said pyroelectric infrared detection element further comprises a slit penetrating through said pyroelectric substrate in the thickness direction, and said slit is designed to surround said infrared absorption part.

9. An infrared sensor comprising:

a pyroelectric infrared detection element defined by claim 1; and a package configured to accommodate said pyroelectric infrared detection element.

10. An infrared sensor as set forth in claim 9, wherein said infrared sensor further comprises a signal processing circuit configured to generate a signal indicative of predetermined information based on a current flowing between said first output terminal and said second output terminal, wherein said package is configured to accommodate said signal processing circuit, said package is provided with a window part designed to allow said pyroelectric element of said pyroelectric infrared detection element to receive infrared of a predetermined frequency, and said window part is made of material which transmits infrared of the predetermined frequency.

11. A pyroelectric infrared detection element as set forth in claim 1, wherein said second canceling line is electrically connected to said second connecting line so as to have the same potential as said second connecting line.

* * * * *